United States Patent
Dinger et al.

(10) Patent No.: US 9,996,012 B2
(45) Date of Patent: Jun. 12, 2018

(54) FACET MIRROR FOR USE IN A PROJECTION EXPOSURE APPARATUS FOR MICROLITHOGRAPHY

(71) Applicant: Carl Zeiss SMT GmbH, Oberkochen (DE)

(72) Inventors: Udo Dinger, Oberkochen (DE); Martin Endres, Koenigsbronn (DE); Armin Werber, Gottenheim (DE); Norbert Muehlberger, Aalen-Ebnat (DE); Florian Bach, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/202,104

(22) Filed: Jul. 5, 2016

(65) Prior Publication Data

US 2016/0313646 A1  Oct. 27, 2016

Related U.S. Application Data

(63) Continuation of application No. 12/848,603, filed on Aug. 2, 2010, now Pat. No. 9,411,241, which is a
(Continued)

(30) Foreign Application Priority Data

Feb. 15, 2008 (DE) .......... 10 2008 009 600
Jan. 9, 2009 (DE) .......... 10 2009 000 099

(51) Int. Cl.
*G03B 27/54* (2006.01)
*G03B 27/42* (2006.01)
(Continued)

(52) U.S. Cl.
CPC ............ *G03F 7/702* (2013.01); *G02B 5/09* (2013.01); *G02B 26/06* (2013.01);
(Continued)

(58) Field of Classification Search
CPC .. G02B 26/0833; G02B 26/105; G02B 26/06; G02B 26/101; G02B 26/0841;
(Continued)

(56) References Cited

U.S. PATENT DOCUMENTS 6,195,201 B1  2/2001  Koch et al.
6,438,199 B1  8/2002  Schultz et al.
(Continued)

FOREIGN PATENT DOCUMENTS

CA   2296899        7/2000
CN   1650234 A     8/2005
(Continued)

OTHER PUBLICATIONS

The International Search Report for the corresponding PCT Application No. PCT/EP2009/000825, filed Feb. 6, 2009.
(Continued)

*Primary Examiner* — Mesfin Asfaw
(74) *Attorney, Agent, or Firm* — Fish & Richardson P.C.

(57) ABSTRACT

A facet mirror is to be used as a bundle-guiding optical component in a projection exposure apparatus for microlithography. The facet mirror has a plurality of separate mirrors. For individual deflection of incident illumination light, the separate mirrors are in each case connected to an actuator in such a way that they are separately tiltable about at least one tilt axis. A control device, which is connected to the actuators, is configured in such a way that a given grouping of the separate mirrors can be grouped into separate mirror groups that include in each case at least two separate mirrors. The result is a facet mirror which, when installed in the projection exposure apparatus, increases the variability for setting various illumination geometries of an object field to be illuminated by the projection exposure
(Continued)

apparatus. Various embodiments of separate mirrors for forming the facet mirrors are described.

16 Claims, 20 Drawing Sheets

Related U.S. Application Data continuation of application No. PCT/EP2009/000825, filed on Feb. 6, 2009.

(60) Provisional application No. 61/143,456, filed on Jan. 9, 2009, provisional application No. 61/028,931, filed on Feb. 15, 2008.

(51) Int. Cl.
| | |
|---|---|
| *G03F 7/20* | (2006.01) |
| *G02B 26/06* | (2006.01) |
| *G02B 26/08* | (2006.01) |
| *G02B 5/09* | (2006.01) |
| *G02B 27/09* | (2006.01) |

(52) U.S. Cl.
CPC ..... *G02B 26/0816* (2013.01); *G02B 26/0833* (2013.01); *G02B 27/0927* (2013.01); *G03F 7/70075* (2013.01); *G03F 7/70116* (2013.01)

(58) Field of Classification Search
CPC .............. G02B 26/085; G02B 27/0068; G02B 26/0808; G02B 26/0858; G02B 6/3556; G02B 21/008; G02B 21/04; G02B 21/082; G02B 26/08; G02B 27/0977; G02B 6/3546; H04N 5/7458; H04N 9/3155
See application file for complete search history.

(56) References Cited

U.S. PATENT DOCUMENTS

| | | | |
|---|---|---|---|
| 6,438,299 | B1 | 8/2002 | Brown et al. |
| 6,507,440 | B1 | 1/2003 | Schultz |
| 6,658,084 | B2 | 12/2003 | Singer |
| 6,700,644 | B2 | 3/2004 | Sweatt |
| 6,859,515 | B2 | 2/2005 | Schulz et al. |
| 7,061,582 | B2 | 6/2006 | Zinn et al. |
| 7,196,841 | B2 | 3/2007 | Melzer et al. |
| 9,411,241 | B2 | 8/2016 | Dinger et al. |
| 2002/0136351 | A1 | 9/2002 | Singer |
| 2003/0002022 | A1 | 1/2003 | Schultz |
| 2003/0012333 | A1 | 1/2003 | Schultz et al. |
| 2003/0038225 | A1 | 2/2003 | Mulder et al. |
| 2003/0227606 | A1 | 12/2003 | Sweatt |
| 2004/0119961 | A1 | 6/2004 | Singer et al. |
| 2005/0002090 | A1 | 1/2005 | Singer et al. |
| 2005/0030653 | A1 | 2/2005 | Holderer et al. |
| 2005/0030656 | A1 | 2/2005 | Holderer et al. |
| 2005/0099616 | A1 | 5/2005 | Loopstra et al. |
| 2005/0174650 | A1 | 8/2005 | Melzer et al. |
| 2006/0103908 | A1 | 5/2006 | Loopstra et al. |
| 2006/0132747 | A1 | 6/2006 | Singer et al. |
| 2007/0273859 | A1 | 11/2007 | Komatsuda |
| 2008/0225259 | A1 | 9/2008 | Singer et al. |
| 2008/0239268 | A1* | 10/2008 | Mulder ............... G03F 7/70116 355/67 |
| 2008/0278704 | A1 | 11/2008 | Endres et al. |
| 2010/0272959 | A1 | 10/2010 | Boehlen et al. |
| 2011/0001947 | A1 | 1/2011 | Dinger et al. |

FOREIGN PATENT DOCUMENTS

| | | |
|---|---|---|
| CN | 1774675 A | 5/2006 |
| DE | 10 2006 036 064 | 2/2006 |
| EP | 1 225 481 | 7/2002 |
| EP | 1 289 273 | 3/2003 |
| EP | 1 947 682 | 7/2008 |
| GB | 2438601 | 12/2007 |
| JP | H 08-0081168 | 3/1996 |
| JP | H 11-150051 | 6/1999 |
| JP | 2000-223415 | 8/2000 |
| JP | 2001-051199 | 2/2001 |
| JP | 2002-203784 | 7/2002 |
| JP | 2003-022967 | 1/2003 |
| JP | 2006-140504 | 6/2006 |
| JP | 2006-523944 | 10/2006 |
| TW | I253545 | 4/2006 |
| TW | 200714930 A | 4/2007 |
| TW | 200900874 A | 1/2009 |
| WO | WO 01/009684 | 2/2001 |
| WO | WO 02/027402 | 4/2002 |
| WO | WO 03/040796 A1 | 5/2003 |
| WO | WO 03/093902 | 11/2003 |
| WO | WO 2005/026843 A2 | 3/2005 |
| WO | WO 2007/138805 A1 | 12/2007 |

OTHER PUBLICATIONS

Istvan Reimann, "Parkette, geometrisch betrachtet" (A geometric view of tilings), in "Mathematisches Mosaik" (*Mathematical Mosaic*), Cologne (1977). (English translation).
Yeow et al., "Micromachined 2-D scanner for 3-D optical coherence tomography," *Sensors and Actuators A 117* (2005) 331-340.
Taiwanese office action, with English translation thereof, for corresponding TW Appl No. 98 104 633, dated Nov. 5, 2013.
Taiwanese office action, with English translation thereof, for TW Appl No. 98 104 633, dated May 16, 2014.
Japanese office action, with English translation thereof, for JP Appl No. 2010-546247, dated Dec. 27, 2012.
Chinese office action, with English translation thereof, for CN application Appl No. 2009 8010 5364.3, dated Nov. 2, 2011.
Chinese office action and search report, with English translation thereof, for CN Appl No. 2013 10 194 962.0, dated Oct. 29, 2014.
Korean office action, with English translation thereof, for KR Appl application No. 10-2010-7020158, dated Feb. 23, 2015.
Korean office action with English translation thereof, for KR Appl application No. 10-2014-7002581, dated Feb. 23, 2015.
Taiwanese office action and search report, with English translation thereof, for corresponding TW Appl No. 98104633, dated Aug. 24, 2016.
Taiwanese office action and search report, with English translation thereof, for corresponding TW Appln No. 104102293, dated Aug. 24, 2106.
Japanese office action, with English translation thereof, for corresponding JP Appln No. 2016-020985, dated Oct. 18, 2106.
European office action for corresponding European application No. 09 709 960.0, dated Dec. 19, 2016.
Taiwanese Office Action and Search Report, with translation thereof, for corresponding TW Appl No. 104102293, dated Sep. 6, 2017.

* cited by examiner

FACET MIRROR FOR USE IN A PROJECTION EXPOSURE APPARATUS FOR MICROLITHOGRAPHY

CROSS-REFERENCE TO RELATED APPLICATIONS

This application is a continuation of, and claims benefit under 35 USC 120 to, U.S. application Ser. No. 12/848,603, filed Aug. 2, 2010, which is a continuation of, and claims benefit under 35 USC 120 to, international application PCT/EP2009/000825, filed Feb. 6, 2009, which claims benefit of German Application No. 10 2009 000 099.2 and U.S. Ser. No. 61/143,456, both filed Jan. 9, 2009 and German Application No. 10 2008 009 600.8 and U.S. Ser. No. 61/028,931, both filed Feb. 15, 2008. U.S. application Ser. No. 12/848,603 and international application PCT/EP2009/000825 are hereby incorporated by reference in their entirety.

FIELD

The disclosure relates to a facet mirror for use as bundle-guiding optical component in a projection exposure apparatus for microlithography. Further, the disclosure relates to an illumination optics for a projection exposure apparatus for microlithography including at least one such facet mirror, a projection exposure apparatus including an illumination optics, a method of producing a micro- or nanostructured component using such a projection exposure apparatus, and a micro- or nanostructured component produced by such a method.

BACKGROUND

Facet mirrors are disclosed in U.S. Pat. No. 6,438,299 B1 and U.S. Pat. No. 6,658,084 B2.

SUMMARY

The disclosure provides a facet mirror configured so that, by installing this facet mirror in the projection exposure apparatus, the variability for setting various illumination geometries to illuminate an object field using the projection exposure apparatus is increased.

As the facet mirror is, according to the disclosure, divided into a plurality of separate mirrors that are tiltable independently of one another, the facet mirror is variably dividable into separate mirror groups. This may be useful for generating groups with different boundaries for adaptation to the shape of an object field to be illuminated. The separate mirrors are actuable individually, which ensures a plurality of various illuminations of the object field without losing any light by blocking or shading. In particular an illumination optics, which may be equipped with the facet mirror, is adaptable to optical parameters of a radiation source, for instance to a beam divergence or an intensity distribution across the beam cross-section. The facet mirror may be designed in such a way that several separate mirror groups illuminate the entire object field in each case on their own. The facet mirror according to the disclosure may be provided with more than 10, more than 50 or even more than 100 of such separate mirror groups. A separate-mirror illumination channel is the part of the beam path of an illumination light bundle guided by the facet mirror which is guided by exactly one of the separate mirrors of the facet mirror. According to the disclosure, at least two separate-mirror illumination channels of this type are involved for illumination of the entire object field. In the example of the facet mirrors according to U.S. Pat. No. 6,438,199 B1 and U.S. Pat. No. 6,658,084 B2, the separate-mirror illumination channels illuminate in each case object field portions whose size corresponds to the object field.

The separate mirrors may have such a mirror surface that more than two separate-mirror illumination channels are involved for illuminating the entire object field. According to this example of separate mirrors, the allocated separate-mirror illumination channels are able to illuminate the object field separately of one another or the separate-mirror illumination channels may be arranged in such a way as to overlap with each other in a defined way. The object field can be illuminated by more than two separate-mirror illumination channels, for instance by more than ten separate-mirror illumination channels.

In some embodiments, a facet mirror is in particular used as a field facet mirror in an illumination optics of the projection exposure apparatus. Depending on the size and shape of the separate mirror groups, a corresponding size and shape of the object field to be illuminated is achievable. In rectangular object fields, the facet aspect ratio of the separate facets, which are in each case formed by one separate mirror group, corresponds to the field aspect ratio. The separate mirror groups need not have a fixed arrangement of separate mirrors. For instance, the separate mirrors are actuable in such a way as to allow a plurality of selected separate mirrors to be variably allocated to a separate mirror group, and consequently, to a facet having a given shape. In operation, the facet mirror is then able to support various given facet shapes, depending on the given separate mirror group the facet is formed of.

Instead of separate facets whose shape corresponds to the entire shape of the object field, separate facets or groupings of separate facets may be formed which correspond to half fields, in other words a field which extends along half an object field dimension. Two half fields of this type are in each case combined for illumination of the entire object field. It is also conceivable to form separate facets or groupings of separate facets whose shape corresponds to partial fields of the object field. Several partial fields of this type, which may be complementary to each other, may then be combined for illumination of the entire object field.

In some embodiments, group shapes are well adapted to current object field geometries. An arcuate, annular or circular envelope may also be obtained by pixel-by-pixel approximation by selecting, from a raster arrangement of separate mirrors, a separate mirror group whose boundary is similar to the shape of the desired envelope.

In some embodiments, a facet mirror is in particular used as a pupil facet mirror in an illumination optics of the projection exposure apparatus.

The illumination optics can be equipped with a field facet mirror which is divided into separate mirrors according to the disclosure, and a pupil facet mirror which is divided into separate mirrors according to the disclosure. A particular illumination angle distribution, in other words an illumination setting, may then be achieved virtually without loss of light by arranging the separate mirror groups in corresponding groups on the field facet mirror and the pupil facet mirror. A specular reflector of the type which is for instance described in US 2006/0132747 A1 may also be divided into separate mirrors according to the disclosure. As the specular reflector is used to adjust both the intensity distribution and the illumination angle distribution in the object field, the additional variability due to the division into separate mirrors is particularly beneficial.

Some embodiments may be obtained using constructive solutions which are already known from the field of micromirror arrays. A micro-mirror array is for instance described in U.S. Pat. No. 7,061,582 B2. The type of tiling that is selected depends on the desired shapes of the separate mirror groups. In particular, a tiling may be used which is known from Istvan Reimann: "Parkette, geometrisch betrachtet" (*A geometric view of tilings*), in "Mathematisches Mosaik" (*Mathematical Mosaic*), Cologne (1977) and Jan Gulberg: "Mathematics—From the birth of numbers", New York/London (1997).

Each of the separate mirrors may have a plane reflecting surface. The construction of such a separate mirror involves a comparatively small amount of effort. Even plane separate mirrors of this type allow separate mirror groups to be formed with approximately curved reflecting surfaces. Alternatively, the separate mirrors of the facet mirror may be curved, in particular curved elliptically, which results in a bundle-forming effect of the separate mirrors on the illumination or imaging light, respectively. The separate mirrors are in particular concavely curved. The facet mirror may in particular be a multi-ellipsoid mirror. Curved separate mirrors of this type may be replaced by separate mirror groups with plane reflecting surfaces, wherein the non-plane surfaces of a replaced curved separate mirror of this type are approximated by a polyhedron of micro-facets.

The separate mirrors may be separately actuable for displacement along a normal to the reflecting surface of the facet mirror. Such a displaceability increases the variability when setting particular topographies of the reflecting surface of the facet mirror. This not only allows one to form groups but to define particular curvatures and free surfaces for the reflecting surfaces within the respective groupings which have a desired imaging or any other bundle-forming effect. As the separate mirrors are separately actuable for displacement along a normal to the reflecting surface, mutual shadings among the separate mirrors can be minimized.

The separate mirrors of a separate facet or of a mirror region may be arranged in rows and columns. Such an arrangement may also be achieved using constructive solutions which are known from the field of micro-mirror arrays.

The control device may be connected to the actuators via a signal bus. Such an actuation ensures a fast and individual actuation of the separate mirrors according to the setting.

The control device may be configured for collective actuation of the separate mirrors in a row. If required, for instance when grouping or collectively blocking out separate mirrors, such a parallel actuation, in particular by rows or columns, allows separate mirrors to be actuated collectively without any effort.

The control device may be configured in such a way that an actuation of individual separate mirrors of one separate mirror group may be individually different from that of the remaining separate mirrors of the separate mirror group. Such a design enables a homogeneity of the object field illumination to be corrected in terms of the illumination intensity across the object field or in terms of adjusting a particular field-dependent illumination intensity profile. Alternatively or additionally, a pupil illumination may be set by individually actuating the separate mirrors so that an intensity distribution of the illumination of a pupil plane can be set by actuating the separate mirrors. Distributing the illumination intensity of a pupil plane by actuating the separate mirrors may in particular take place in dependence on a field size or a field shape to be illuminated. Alternatively or additionally, the illumination intensity in the pupil plane may be distributed by actuating the separate mirrors in such a way that a given variation of the incident illumination angles is set via the object field to be illuminated. For instance, the illumination angle distribution in the center of the field may then be different from that at the field edges.

The individual actuation of the separate mirrors may of course also be used to compensate for inhomogeneities of the intensity distribution or illumination angle distribution across the object field which are due to other causes, or more generally speaking, to correct deviations from default intensity distribution values or illumination angle distribution values that have been detected across the object field.

All separate mirrors may be arranged on a common plane carrier. Such a plane carrier facilitates the production of the facet mirror. A plane arrangement of the carrier of the facet mirror is achievable by correspondingly forming illumination light or imaging light upstream of the facet mirror.

A mirror body of at least one of the separate mirrors may be tiltable relative to a rigid carrier body about at least one tilt axis of a tilt joint. The tilt joint may be a solid joint, the solid joint having a joint thickness S perpendicular to the tilt axis and a joint length L along the tilt axis, with L/S>50. At a given low stiffness, which in particular allows adjustments to be performed with little effort, such a relationship of the joint length to the joint thickness ensures a sufficient heat dissipation via the solid joint from the mirror body to the carrier body. The joint length, which is large compared to the joint thickness, provides a sufficiently large cross-section for heat transfer via the solid joint. When adjusting the separate mirror, the joint thickness, which is small compared to the joint length, allows a given angular deflection of the mirror body to be achieved with little effort. This allows one to use actuating elements for tilting the mirror body which involve little effort and may therefore be very compact, for example. Suitable actuating elements for tilting the mirror body are in particular those which are installed in conventional micro-mirror arrays. Micro-mirror arrays of this type are known to those skilled in the art as "MEMS" (Micro-electromechanical systems) which are for instance disclosed in EP 1 289 273 A1. Compared to conventional torsion suspensions of micro-mirrors (cf. Yeow et al., Sensors and Actuators A 117 (2005), 331-340) having a much smaller L/S ratio, the heat transfer is considerably improved when using the solid joints according to the disclosure. This is of particular advantage if heat due to considerable residual absorption needs to be dissipated from the mirror body, as is the case for instance when using EUV radiation as useful light which is reflected by the separate mirror. The heat transfer between the mirror body and the carrier body may additionally be improved by providing micro channels in the carrier body which permit an active cooling via an in particular laminarly flowing cooling liquid.

In some embodiments, the advantages of an illumination optics correspond to those which have already been described above with reference to the facet mirror according to the disclosure.

The illumination optics may include two facet mirrors described above. Such an illumination optics may in particular combine the advantages of a field facet mirror formed of separate mirrors with those of a pupil facet mirror formed of separate mirrors, which allows for the most different illumination settings without losing virtually any light. The pupil facet mirror may have a larger number of separate mirrors than the upstream field facet mirror. The upstream field facet mirror enables various illumination shapes of the pupil facet mirror and therefore various illumination settings of the illumination optics to be achieved if the facets involved for adjustment are correspondingly actuable for displacement, in particular tiltable. The pupil facet mirror may in particular have a number of separate mirrors which is larger than the number of separate facets of the field facet mirror. If the separate facets are in turn composed of separate mirror groups, the field facet mirror may have a larger number of separate mirrors than the pupil facet mirror.

In some embodiments, a partial object field illumination further increases the flexibility in terms of object field illumination, resulting in an additional degree of freedom for correction. A relative displacement of the illuminated object field portions within the object field correspondingly allows the object field illumination to be corrected.

The facet mirror may be arranged in a field plane of the illumination optics. The advantages of an illumination optics including such a field facet mirror correspond to those which have already been explained above with reference to the illumination optics according to the disclosure.

In some embodiments, the advantages of a projection exposure apparatus correspond to those which have already been discussed above.

The radiation source may be an EUV radiation source. Such a projection exposure apparatus enables a high structural resolution to be obtained.

In some embodiments, a specular reflector reduces the number of reflections of the illumination light that are involved in an illumination optics. This increases the total transmission of the illumination optics.

A bundle formation of the illumination light upstream of the specular reflector may be designed in such a way that the specular reflector is discretely illuminated with a plurality of images of the radiation source which are allocated to the separate mirrors of the specular reflector. Such a discrete illumination allows the separate mirrors of the specular reflector to be arranged at a distance from each other, which provides enough space for devices such as suspension and displacement mechanisms or displacement actuators for the separate mirrors to be arranged between the separate mirrors.

The facet mirror may be arranged between the radiation source and a specular reflector. Such a facet mirror may for instance be a collector facet mirror. A collector facet mirror of this type, which may in particular include ellipsoidal separate mirrors, is generally applicable in illumination optical systems which do not use a specular reflector.

The facet mirror may be arranged between the radiation source and the specular reflector and may include a smaller number of separate mirrors than the specular reflector. If such a specular reflector has more separate mirrors than the upstream facet mirror, the upstream facet mirror may be used to generate various illumination shapes of the specular reflector and therefore various illumination settings of the illumination optics. Different illumination angle distributions of the object field are also achievable by the illumination optics if the number of the separate mirrors of the specular reflector is smaller than the number of separate mirrors of the upstream facet mirror. The number of separate mirrors of the field facet mirror may considerably exceed the number of separate mirrors of the specular reflector.

Between the radiation source and the at least one facet mirror a collector for the illumination light may be arranged. Such a collector reduces the demands on the downstream facet mirror in terms of illumination light bundle formation. The at least one facet mirror may be exposed to convergent illumination from the collector.

The collector may have a continuous, in other words non-faceted mirror surface. Such a collector is produced with less effort than a facet mirror.

In some embodiments, an angle between the scanning direction and the long field axis prevents or reduces inhomogeneous illumination when the object field is partially illuminated. This angle amounts to 10°, for example. Other angles, for instance in the range between 1 and 3°, in the range of 3 and 5°, in the range between 5 and 7° or in the range between 7 and 9° are conceivable as well. Angles larger than 10° are generally conceivable as well. Alternatively, the object field portions may be arranged in such a way that there are no continuous boundaries between the object field portions along a scanning direction. Alternatively or additionally, the separate mirrors may be oriented in such a way that edges of the separate mirrors which are imaged into the object field via the illumination optics, are not parallel to the scanning direction. The separate mirrors of the at least one facet mirror of the illumination optics may be arranged in such a way that shadows in the images of separate mirror groups are offset relative to each other perpendicular to the scanning direction so as to prevent an intensity reduction caused by the shadows from adding up at particular positions of the long field axis, in other words at particular field heights.

In some embodiments, the advantages of a production method and of a microstructured component correspond to those which have already been explained above with reference to the disclosure. Microstructured components can be obtained which show high integration densities even in the submicrometer range.

BRIEF DESCRIPTION OF THE DRAWINGS

Embodiments of the disclosure will hereinafter be explained in association with the drawings, in which.

DETAILED DESCRIPTION

Figure 1:
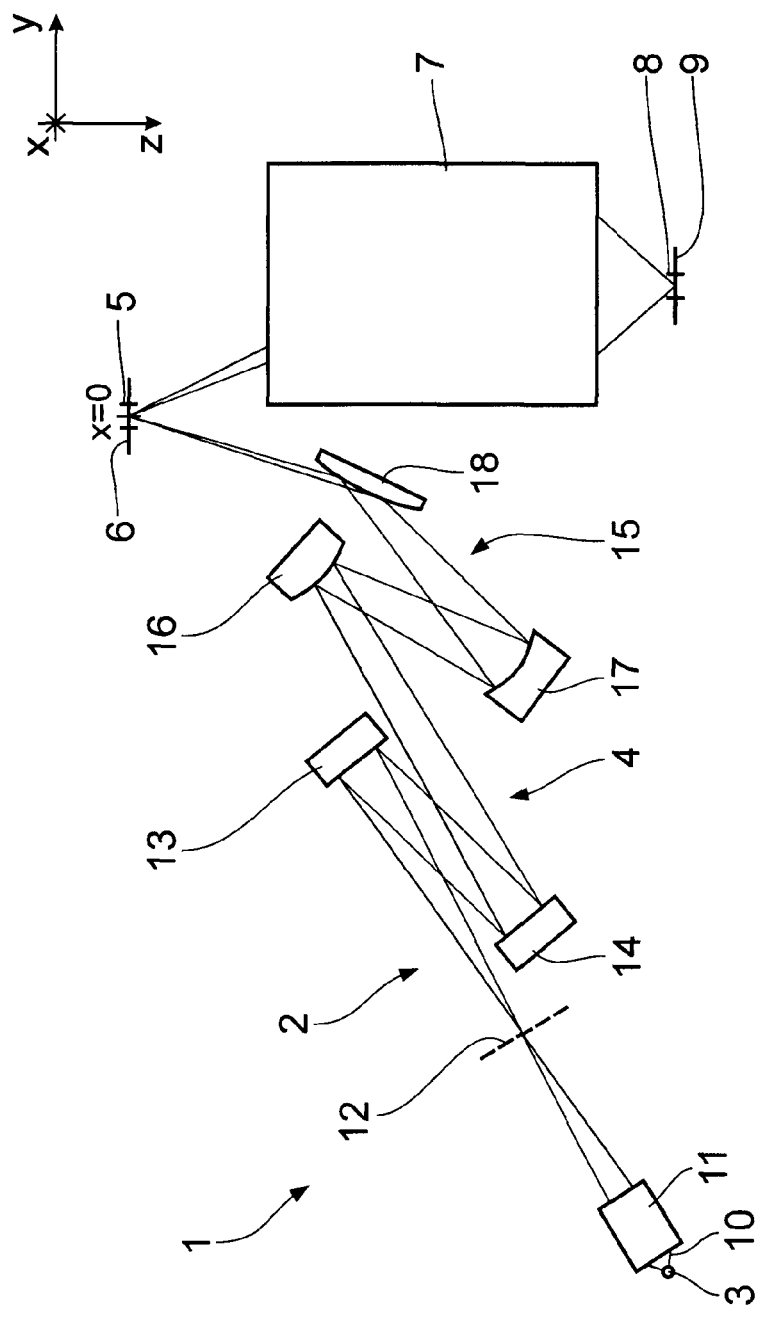
FIG. 1 shows a schematic meridional section through a projection exposure apparatus for EUV projection lithography.

FIG. 1 shows a schematic meridional section through a projection exposure apparatus 1 for microlithography. An illumination system 2 of the projection exposure apparatus 1 has a radiation source 3 and an illumination optics 4 for illuminating an object field 5 in an object plane 6. In this process, a reticle (not shown in the drawing) is illuminated which is arranged in the object field 5 and which is held in place by a reticle holder (not shown). A projection optics 7 is used to image the object field 5 into an image field 8 in an image plane 9. A structure on the reticle is imaged onto a light-sensitive layer of a wafer (not shown in the drawing) which is arranged in the image plane 9 in the region of the image field 8 and which is held in place by a wafer holder (not shown).

The radiation source 3 is an EUV radiation source which emits useful light in the range between 5 nm and 30 nm. The radiation source may be a plasma source, for instance a GDPP source (gas discharge produced plasma) or a LPP source (laser produced plasma). A radiation source on the basis of a synchrotron is applicable as the radiation source 3 as well. Those skilled in the art will find useful information concerning a radiation source of this type in U.S. Pat. No. 6,859,515 B2, for example. EUV radiation 10, which is emitted by the radiation source 3, is focused by a collector 11. A corresponding collector is disclosed in EP 1 225 481 A. Downstream of the collector 11, the EUV radiation 10 propagates through an intermediate focal plane 12 before hitting a field facet mirror 13. The field facet mirror 13 is arranged in a plane of the illumination optics 4 which is optically conjugated with the object plane 6.

The EUV radiation 10 is hereinafter also referred to as illumination light or imaging light.

Downstream of the field facet mirror 13, the EUV radiation 10 is reflected by a pupil facet mirror 14. The pupil facet mirror 14 is arranged in a pupil plane of the illumination optics 4 which is optically conjugated with a pupil plane of the projection optics 7. Via the pupil facet mirror 14 and an imaging optical assembly in the form of a transmission optics 15 including mirrors which are denoted by 16, 17 and 18 corresponding to the direction of the beam path, separate field facets 19 of the field facet mirror 13, which are also referred to as subfields or separate mirror groups and which will hereinafter be described in more detail, are imaged into the object field 5. The last mirror 18 of the transmission optics 15 is a grazing incidence mirror.

FIG. 1 shows a Cartesian xyz coordinate system which facilitates the description of positional relationships, the coordinate system being a global coordinate system for description of the positional relationships of components of the projection exposure apparatus 1 between the object plane 6 and the image plane 9. The x-axis extends perpendicular to and into the drawing plane in FIG. 1. The y-axis extends towards the right in FIG. 1. The z-axis extends downward in FIG. 1 and is therefore perpendicular to the object plane 6 and to the image plane 9.

Figure 2:
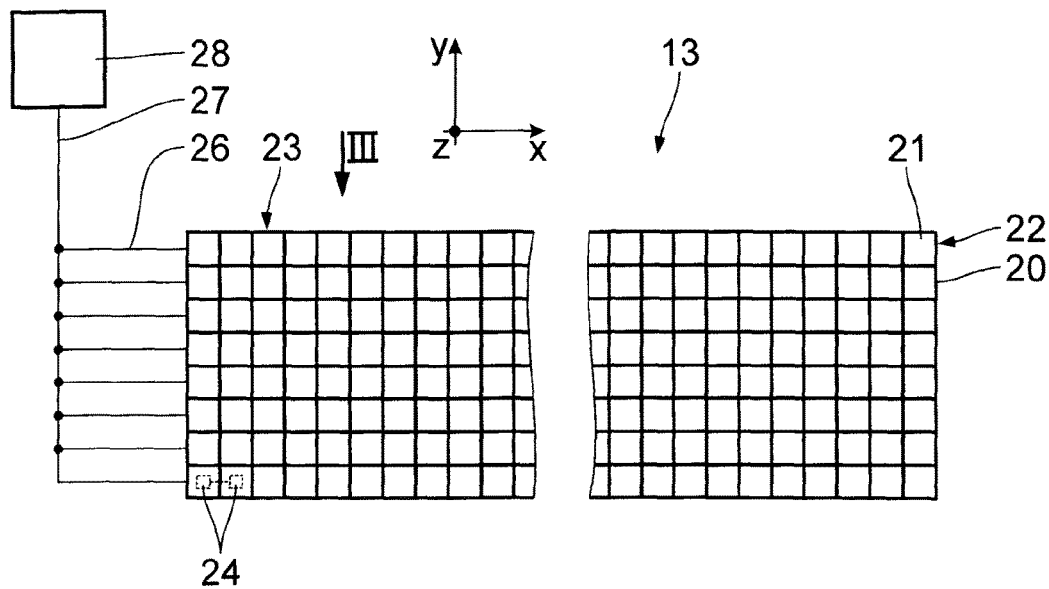
FIG. 2 shows a schematic plan view of a portion of a field facet mirror which is composed of separate mirrors for use in the projection exposure apparatus according to FIG. 1.

FIG. 2 shows a highly schematic view of constructional details of the field facet mirror 13. An entire reflecting surface 20 of the field facet mirror 13 is divided into rows and columns so as to form a raster of separate mirrors 21. The individual reflecting surfaces of each of the separate mirrors 21 are plane. A row 22 of separate mirrors includes a plurality of directly adjacent separate mirrors 21. One row 22 of separate mirrors may include several tens to several hundreds of the separate mirrors 21. In the example according to FIG. 2, the separate mirrors 21 are in the shape of a square. Other shapes of separate mirrors which allow a tiling to be achieved with as few gaps as possible are applicable as well. Such alternative shapes for separate mirrors are known from the mathematical theory of tiling. In this respect, reference shall be made to Istvan Reimann: "Parkette, geometrisch betrachtet" (*A geometric view of tilings*), in "Mathematisches Mosaik" (*Mathematical Mosaic*), Cologne (1977) and to Jan Gulberg: "Mathematics—From the birth of numbers", New York/London (1997).

The field facet mirror 13 may in particular be configured as described in DE 10 2006 036 064 A1.

Depending on the design of the field facet mirror 13, a column 23 of separate mirrors includes a plurality of separate mirrors 21 as well. One column 23 of separate mirrors is for instance composed of several tens of separate mirrors 21.

FIG. 2 shows a Cartesian xyz coordinate system which serves as a local coordinate system of the field facet mirror 13 for easier description of positional relationships. Corresponding local xyz coordinate systems can also be found in the subsequent Figures which show a plan view of the facet mirror or of a portion thereof. In FIG. 2, the x-axis extends horizontally towards the right and is parallel to the rows 22 of separate mirrors. The y-axis extends upwardly in FIG. 2 and is parallel to the columns 23 of separate mirrors. The z-axis is perpendicular to the drawing plane of FIG. 2 and extends out of the drawing plane.

During a projection exposure, the reticle holder and the wafer holder are scanned synchronously in y-direction. A small angle between the scanning direction and the y-direction is conceivable, as will be explained below.

The reflecting surface 20 of the field facet mirror 13 has an extension of $x_0$ in the x-direction. In the y-direction, the reflecting surface 20 of the field facet mirror 13 has an extension of $y_0$.

Depending on the design of the field facet mirror 13, the separate mirrors 21 have x/y extensions in the range of for instance 600 μm×600 μm to for instance 2 mm×2 mm. The separate mirrors 21 may be shaped in such a way as to have a focusing effect on the illumination light 10. Such a focusing effect of the separate mirrors 21 is of particular advantage when the field facet mirror 13 is exposed to divergent illumination light 3. The entire field facet mirror 13 has an $x_0/y_0$ extension which amounts to for instance 300 mm×300 mm or 600 mm×600 mm, depending on the design. The separate field facets 19 show typical x/y extensions of 25 mm×4 mm or of 104 mm×8 mm. Depending on the relationship between the size of the respective separate field facets 19 and the size of the separate mirrors 21 which form these individual field facets 19, each of the separate field facets 19 has a corresponding number of separate mirrors 21.

Figure 3:
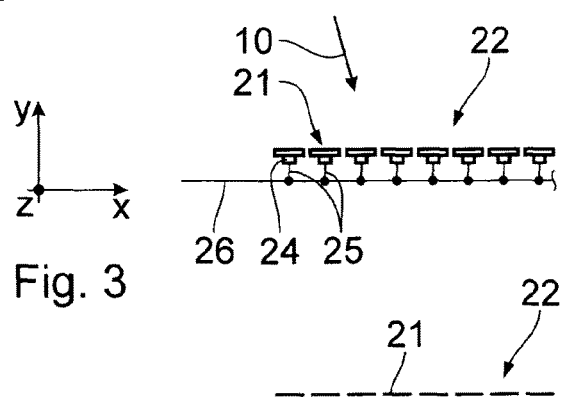
FIG. 3 shows a view of a portion of a row of separate mirrors of the facet mirror according to FIG. 2 from direction III in FIG. 2.

Each of the separate mirrors 21 is connected to an actuator 24 for individual deflection of incident illumination light 10; this is illustrated in FIG. 2 by two dashed separate mirrors 21 which are arranged in a corner on the left-hand side below the reflecting surface 20 as well as in FIG. 3 which shows a more detailed view of a portion of a row 22 of separate facets. The actuators 24 are in each case arranged on a side of the separate mirrors 21 which is remote from a reflecting side of the separate mirrors 21. The actuators 24 may for instance be piezoelectric actuators. Designs of such actuators are known from the design of micro-mirror arrays.

The actuators 24 of a row 22 of separate mirrors are in each case connected to a row signal bus 26 via signal lines 25. One row 22 of separate mirrors is allocated to a respective one of the row signal buses 26. The row signal buses 26 of the rows 22 of separate mirrors are in turn connected to a main signal bus 27. The main signal bus 27 is connected to a control device 28 of the field facet mirror 13 via a signal. The control device 28 is in particular configured to actuate the separate mirrors 21 in parallel, in other words the separate mirrors 21 of one row or one column are actuated collectively.

Each of the separate mirrors 21 is individually tiltable about two tilt axes which are perpendicular to each other, with a first one of these tilt axes being parallel to the x-axis and the second one of the two tilt axes being parallel to the y-axis. The two tilt axes are disposed in the separate reflecting surfaces of the respective separate mirrors 21.

In addition to that, the separate mirrors 21 are individually displaceable in the z-direction via the actuators 24. Consequently, the separate mirrors 21 are actuable separately from each other for displacement along a normal to the reflecting surface 20. This allows the entire topography of the reflecting surface 20 to be changed, as is shown in a highly schematic view in FIGS. 4 to 6. This allows reflecting surface contours to be produced with large sagittal heights, in other words with high variations in the topography of the reflecting surface, in the form of mirror regions resembling Fresnel lenses which are all arranged in one plane. A division into mirror regions resembling Fresnel zones eliminates a basic curvature of such a mirror surface topography with a large sagittal height.

Figure 4:
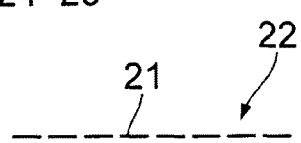
FIGS. 4 to 6 show highly schematic views of various shapes of a row of reflecting surfaces which is formed by the separate mirrors of the row of separate mirrors shown in FIG. 3, the row of reflecting surfaces being shown in three different configurations.

FIG. 4 shows separate reflecting surfaces of the separate mirrors 21 of a section of a row 22 of separate mirrors, with all separate mirrors 21 of this row 22 of separate mirrors being set to the same absolute z-position via the control device 28 and the actuators 24. The result is a plane row reflecting surface of the row 22 of separate mirrors. If all separate mirrors 21 of the field facet mirror 13 are set according to FIG. 4, the entire reflecting surface 20 of the field facet mirror 13 is plane.

Figure 5:
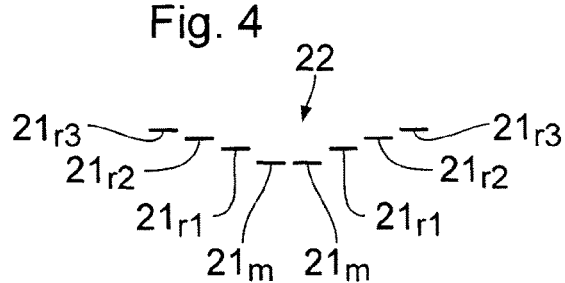

FIG. 5 shows an actuation of the separate mirrors 21 of the row 22 of separate mirrors where the central separate mirror $21_m$ is displaced in the negative z-direction with respect to adjacent separate mirrors $21_{r1}$, $21_{r2}$, $21_{r3}$. This results in a stepped arrangement which causes a corresponding phase offset of the EUV radiation 10 impinging upon the row 22 of separate mirrors according to FIG. 5. The EUV radiation 10 reflected by the two central separate mirrors $21_m$ is subject to the greatest phase offset. The separate mirrors $21_{r3}$ at the edges generate the lowest phase offset. The separate mirrors $21_{r1}$, $21_{r2}$ disposed inbetween generate a phase lag which gradually becomes lower and lower with respect to the phase lag generated by the central separate mirrors $21_m$.

Figure 6:
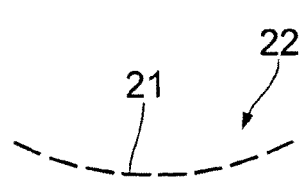

FIG. 6 shows an actuation of the separate mirrors 21 on the displayed section of the row 22 of separate mirrors in such a way that a convex row 22 of separate mirrors is formed on the one hand by the offset arrangement of the separate mirrors 21 relative to each other in the z-direction and on the other by orienting the separate mirrors 21 relative to each other. This may be useful for generating an imaging effect of separate mirror groups of the field facet mirror 13. Naturally, a corresponding concave arrangement of groups of separate mirrors 21 is conceivable as well.

Corresponding forms as explained above with reference to FIGS. 5 and 6 are not restricted to the x-dimension but may even continue in the y-dimension of the field facet mirror 13, depending on the actuation via the control device 28.

The individual actuation of the actuators 24 via the control device 28 allows a given grouping of separate mirrors 21 to be arranged in the above-mentioned separate mirror groups each including at least two separate mirrors 21, with in each case one separate mirror group defining a separate field facet 19 of the field facet mirror 13. These separate field facets 19, which are composed of several separate mirrors 21, have the same effect as the field facets which are known for instance from U.S. Pat. No. 6,438,199 B1 or U.S. Pat. No. 6,658,084 B2.

Figure 7:
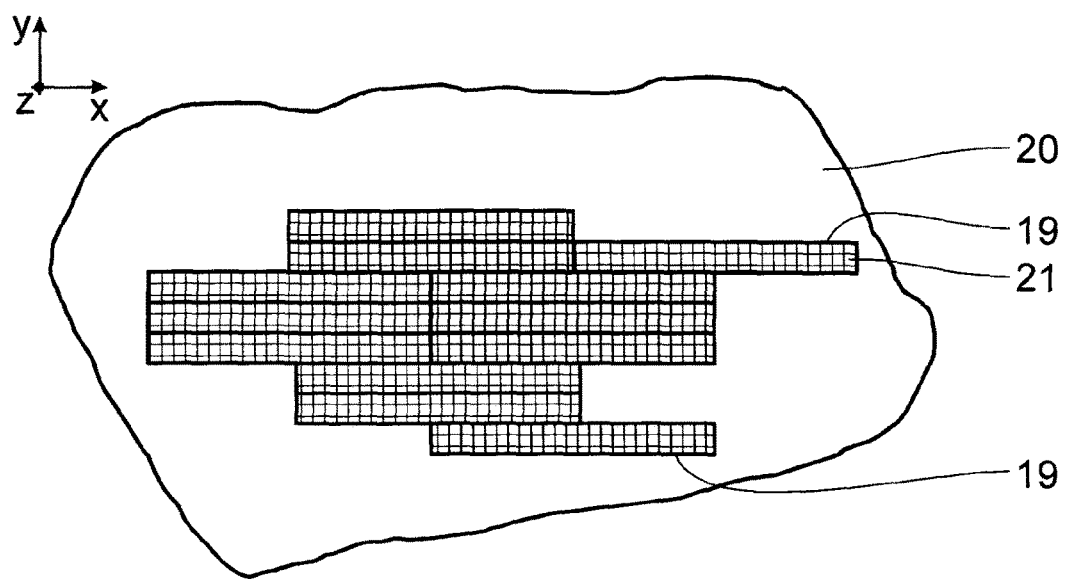
FIG. 7 shows a plan view of a portion of another embodiment of a field facet mirror which is configured of separate facets, the separate mirrors being grouped into exemplary separate mirror groups defining an arrangement of separate facets.

FIG. 7 illustrates a grouping of this type, the Figure showing a section of the reflecting surface 20 of a field facet plate of an alternative embodiment of the field facet mirror 13 including a higher number of separate mirrors 21 compared to the illustration of FIG. 2. Components which correspond to those that have already been explained above with reference to FIGS. 2 to 6 have the same reference numerals and are not discussed in detail again.

On the reflecting surface 20 in the example of FIG. 7, a total of 12 separate mirror groups 19 are formed by combined actuation through the control device 28. Each of the separate mirror groups 19 is composed of a 24×3-array of separate mirrors 21, in other words it has three rows of separate mirrors of twenty-four separate mirrors 21 each. Therefore, each of the separate mirror groups 19, in other words each of the separate field facets formed by this grouping, has an aspect ratio of 8 to 1. This aspect ratio corresponds to the aspect ratio of the object field 5 to be illuminated.

The separate mirrors 21 of each of the separate mirror groups 19 are arranged relative to each other in such a way that the shape of each of the separate mirror groups 19 corresponds to the shape of a separate facet of a conventional field facet mirror. Consequently, each of the separate mirror groups 19 defines a separate facet.

Figure 8:
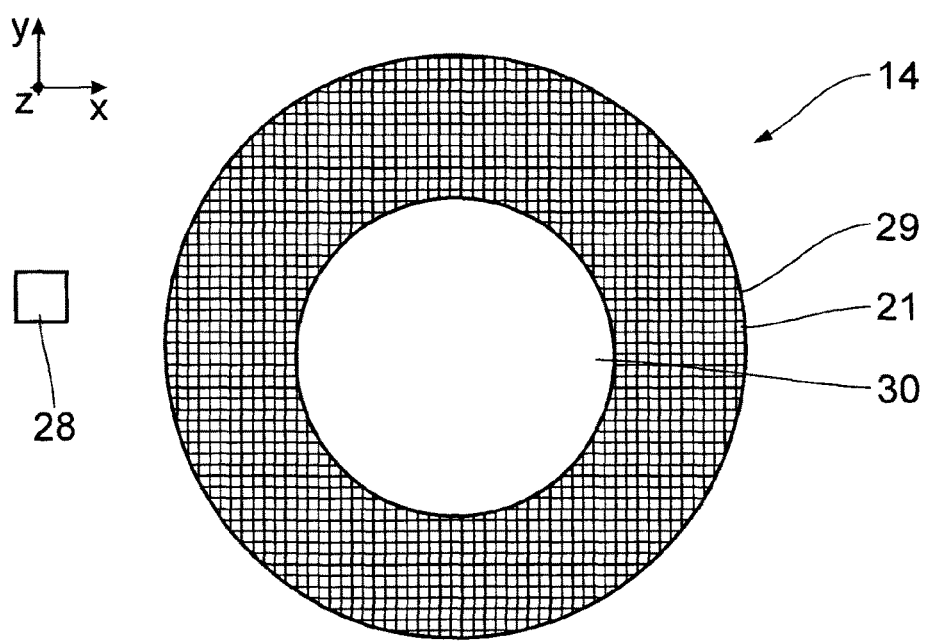
FIG. 8 shows a schematic plan view of a pupil facet mirror which is configured of separate mirrors for use in the projection exposure apparatus according to FIG. 1, for instance for defining various annular or ring-shaped illumination settings.

FIG. 8 shows details of the pupil facet mirror 14 which is installed in the projection exposure apparatus 1. The pupil facet mirror 14 includes a round pupil facet plate 29 which is provided with a plurality of separate mirrors 21. In the embodiment according to FIG. 8, the useful separate mirrors 21 are arranged in an annular configuration about a center 30 of the pupil facet plate 29. An annular width of this configuration approximately corresponds to the width of eleven adjacent separate mirrors 21. Likewise, the center 30 of the pupil facet plate 29 is provided with separate mirrors 21 which are arranged in a corresponding raster pattern as well; these separate mirrors 21 are not shown, however, as they are not in use in the annular, in other words ring-shaped, setting according to FIG. 8.

The separate mirrors 21 of this annular configuration are arranged in a raster pattern of rows and columns corresponding to the above-described field facet mirror 13 according to FIGS. 2 to 7. The separate mirrors 21 of the pupil facet mirror 14 have actuators as well and are actuated by the control device 28. These actuators and the type of the signal connection of the actuation correspond to those of the above-described field facet mirror 13.

The separate mirrors 21 of the pupil facet mirror 14 may be grouped into separate mirror groups as well. This will hereinafter be explained via FIGS. 14 and 15.

FIGS. 9 to 13 show various examples of the separate mirrors 21 of the field facet mirror 13 which are grouped into separate mirror groups.

Figure 9:
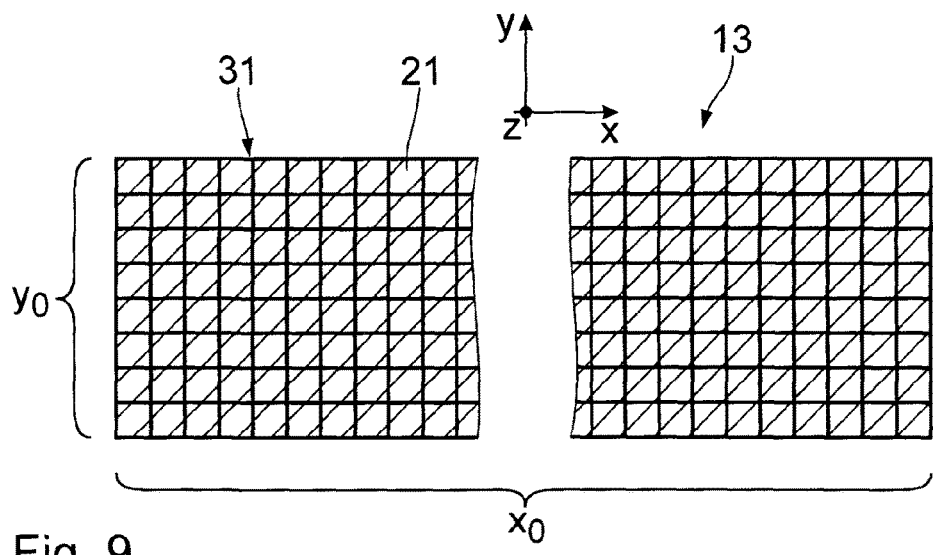
FIGS. 9 to 13 show examples of various groupings of the separate mirrors of the facet mirror according to FIG. 2 which are grouped into separate mirror groups defining separate facets.

FIG. 9 shows the case where all separate mirrors 21 of the field facet mirror 13 are grouped into a single separate mirror group 31. In this case, all separate mirrors 21 of the field facet mirror 13 are actuated by the control device 28 in the same way; for instance, the mirrors, which are in the same z-position, are tilted about the x-axis and about the y-axis through the same tilt angle. If each of these two tilt angles amounts to zero, the field facet mirror 13 will be a plane mirror that is composed of the separate mirrors 21. The total aspect ratio of the field facet mirror 13 is $x_0/y_0$.

Figure 10:
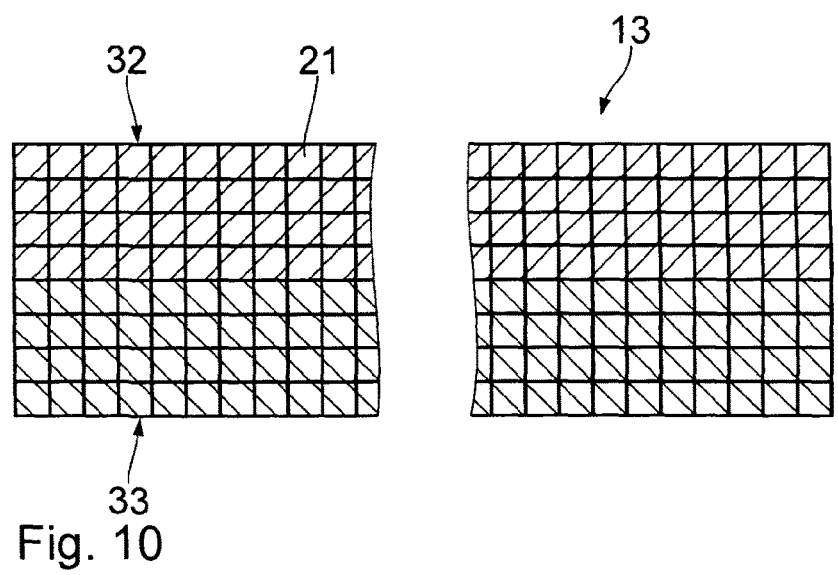

According to FIG. 10, the field facet mirror 13 is divided into two separate mirror groups 32, 33. The upper separate mirror group 32 of FIG. 10 includes the upper half of the field facet mirror 13 while the separate mirror group 33 includes the lower half of the field facet mirror 13. The separate mirrors 21 of each of these two groups 32, 33 are again actuated in the same way by the control device 28. This may result in a field facet mirror including two separate facets which correspond to the separate mirror groups 32, 33. The aspect ratio of these separate facets 32, 33 is $2\,x_0/y_0$.

Figure 11:
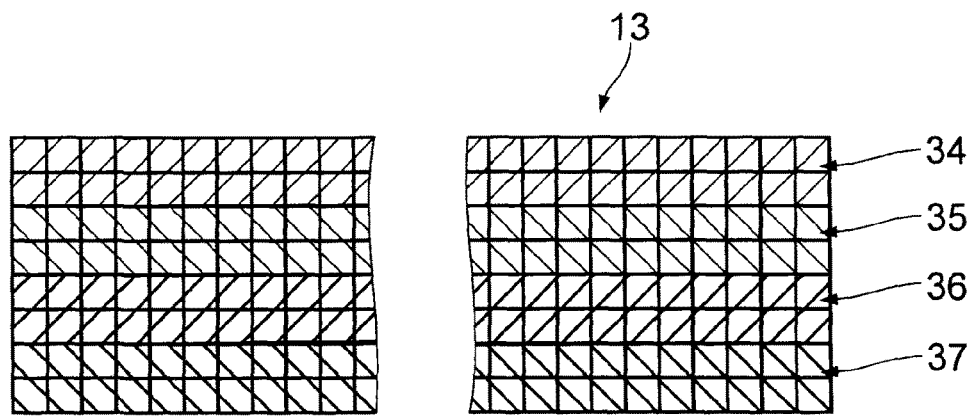

According to FIG. 11, the field facet mirror 13 is divided into a total of four separate mirror groups 34 to 37 which have an aspect ratio of $4\,x_0/y_0$ and cover in each case the entire row width of the reflecting surface 20. Therefore, these four separate mirror groups 34 to 37 define four separate facets having the above aspect ratio.

Figure 12:
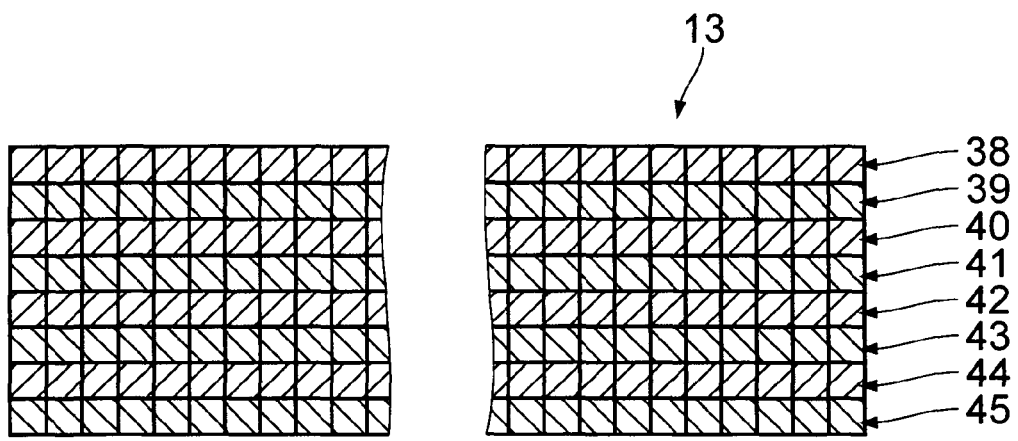

According to FIG. 12, the separate mirrors 21 of the field facet mirror 13 are divided into a total of eight separate mirror groups 38 to 45 which correspond in each case to a row of the field facet mirror 13 and have an aspect ratio of $8\,x_0/y_0$. This grouping may thus produce a field facet mirror having a total of eight separate facets.

Figure 13:
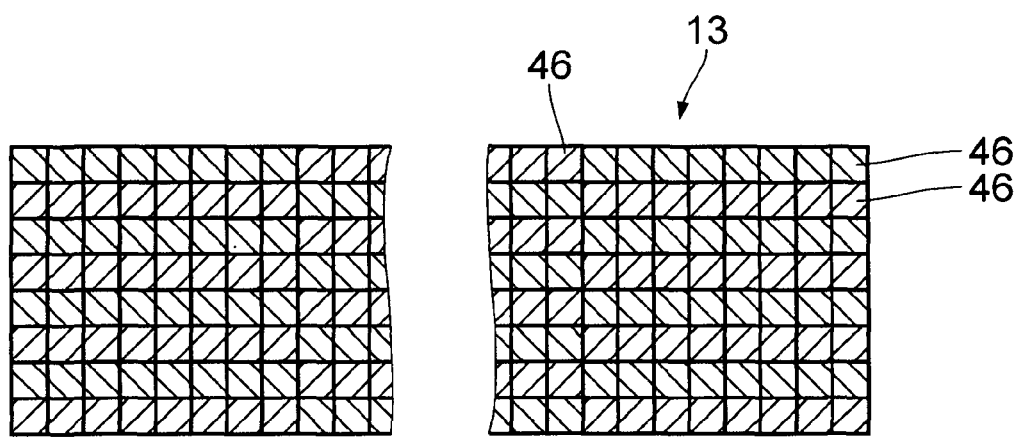

According to FIG. 13, the separate facets 21 of the field facet mirror 13 are grouped in such a way that in each row of the field facet mirror 13, eight adjacent separate mirrors 21 are grouped into in each case one separate mirror group 46. Each of these separate mirror groups 46 has an aspect ratio of 8:1. If each row 22 of separate mirrors of the field facet mirror 13 is composed of for instance 80 separate mirrors 21, then each row 22 according to the grouping of FIG. 13 includes ten separate mirror groups 46, which adds up to a total of 80 separate mirror groups 46. In the embodiment according to FIG. 13, this allows a field facet mirror to be formed with 80 separate facets.

Figure 14:
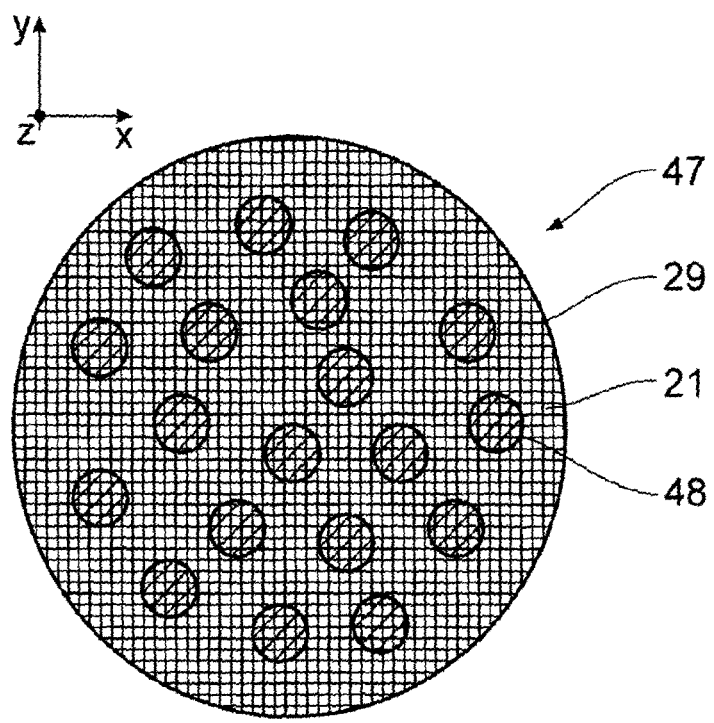
FIG. 14 shows a pupil facet mirror which is similar to FIG. 8 and is also composed of a plurality of separate mirrors, a plurality of separate mirror groups, which are exposed to circular illumination, being illuminated to define a first, approximately conventional illumination setting.
Figure 15:
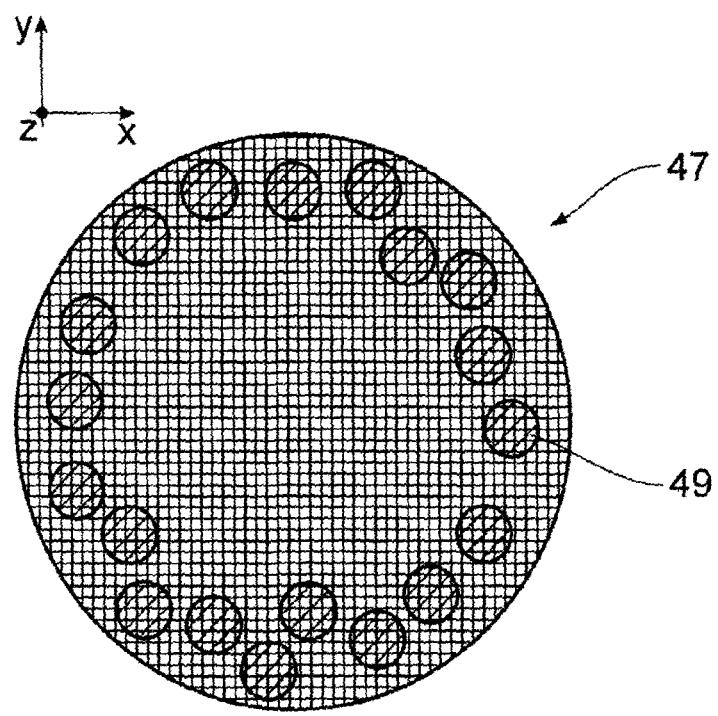
FIG. 15 shows the pupil facet mirror according to FIG. 14, the same number of separate mirror groups being exposed to circular illumination as well so as to define another, approximately ring-shaped illumination setting.

FIGS. 14 and 15 show an illumination of a pupil facet mirror 47, which is similar to the pupil facet mirror 14, by way of a field facet mirror which has a total of nineteen separate mirror groups which are divided into groups according to the above-explained FIGS. 2 to 7 and 9 to 13. Like the pupil facet mirror 14 according to FIG. 8, the round pupil facet plate 29 of the pupil facet mirror 47 is covered with the separate mirrors 21 which form a raster pattern of rows and columns. Illuminated separate mirrors 21 of the pupil facet mirror 47 are indicated by hatched lines. Illumination is directed onto separate mirror groups 48 having an in each case circular boundary. Within the circular boundaries of the separate mirror groups 48, the multiple images are arranged which are generated by the field facet mirror that is arranged upstream in the beam path of the illumination light, the multiple images being the images of a radiation source that is assumed to be circular or being the image of the image of the radiation source. This radiation source may be provided according to the radiation source 1 of FIG. 1 which is assumed to be circular. This image of the radiation source may be disposed in an intermediate focus of the beam path of the illumination and imaging light. These multiple images are also referred to as source images. If the image of the source in the intermediate focus of the pupil facet mirror 47 deviates from a circular shape, the shape of the separate mirror groups 48 may correspondingly be adapted to the shape of the source images. If the image of the radiation source is elliptical, for example, the separate mirror groups 48 on the pupil facet mirror 47 may have a corresponding elliptical boundary. Other shapes of the images of the radiation source or the source images are conceivable as well, for instance hexagonal or rectangular shapes which result in an optimal tiling on the pupil facet mirror 47. Such shapes of the radiation source image are achievable by a corresponding diaphragm arrangement in the intermediate focal plane. The illumination optics 4 may be adapted to changing shapes of the radiation source image in the intermediate faces, which are due to a change of the diaphragm, by changing the group arrangement of separate mirror groups 48 of the pupil facet mirror 47. This is also applicable when the radiation source is changed, for instance when a GDPP radiation source is replaced by an LPP radiation source.

Each of the separate mirror groups 48 of the pupil facet mirror 47 is illuminated by exactly one separate mirror group, for instance by the separate mirror groups 19 (cf. FIG. 7), of the field facet mirror 13. The pupil facet mirror 47 is provided with a total of nineteen illuminated separate mirror groups 48. As already mentioned, the upstream field facet mirror 13 is divided into nineteen allocated separate mirror groups 19. The allocation of the nineteen separate mirror groups 19 of the field facet mirror 13 to the nineteen separate mirror groups 48 on the pupil facet mirror 47 result in a total of nineteen channels for the light path of the EUV radiation 10 from the field facet mirror 13 to the object field 5.

Within each of the separate mirror groups 48 of the pupil facet mirror, nine central separate mirrors 21 are completely illuminated while further separate mirrors 21 surrounding the central separate mirrors 21 are partially illuminated. These at least partially illuminated separate mirrors 21 form the separate mirror group 48 which is to be actuated as a group via the control device 28. The separate mirrors 21 of each of the separate mirror groups 48 are actuated in such a way that an image of the allocated separate mirror group of the field facet mirror 13, for instance the allocated separate mirror group 19 of the embodiment according to FIG. 7, is imaged into the object field 5 via the separate mirror group 48 of the pupil facet mirror 47 and the downstream transmission optics 16. Via the field facet mirror 13, secondary radiation sources are generated at the location of the separate mirror groups 48 which secondary radiation sources are imaged into a pupil plane of the projection plane 7. Therefore, the intensity distribution of the EUV radiation 10 on the pupil facet mirror 47 is directly correlated to an illumination angle distribution of the illumination of the object field 5 in the object plane 6.

In the illumination example according to FIG. 14, the separate mirror groups 48 are approximately equally distributed across the pupil facet plate 29. Consequently, the object field 5 is illuminated by illumination angles which are distributed across the entire aperture of the pupil facet plate 29. The result is an approximately conventional illumination of the object field 5 from all directions which are defined by the image-side numerical aperture of the projection optics 7.

FIG. 15 shows an illumination of the pupil facet mirror 47 which differs from that of FIG. 14, in other words the illumination setting of the projection exposure apparatus 1 has been changed. Separate mirror groups 49 at the edge of the pupil facet plate 29 are illuminated by groupwise or collective actuation of the respective separate mirror groups of the field facet mirror 13, for instance the separate mirror group 19 according to FIG. 7. The result is an approximately annular illumination angle distribution of the illumination of the object field 5 in the object plane 6. A minimum width of a ring of an illumination distribution, which is adjustable in this way, is defined by the width of the separate mirror groups 49.

In order to ensure that the individual field facets are imaged into the object field 5 even when the illumination setting has been changed according to FIG. 15, both the separate field facets, for instance the separate mirror groups 19 of the embodiment according to FIG. 7, and the separate mirrors 21 of the separate mirror groups 49 need to be readjusted correspondingly by tilting the respective groups using the control device 28. In other words, the separate mirror groups of the field facet mirror 13 on the one hand and those of the pupil facet mirror 47 on the other need to be actuated synchronously by the control device 28 when the illumination setting is changed.

An illumination according to FIG. 15 is also possible when using the pupil facet mirror 14 according to FIG. 8. The pupil facet mirror 14 may be used to illuminate the object field with various annular illumination settings which differ by the minimum and maximum illumination angles in the object field 5.

Figure 16:
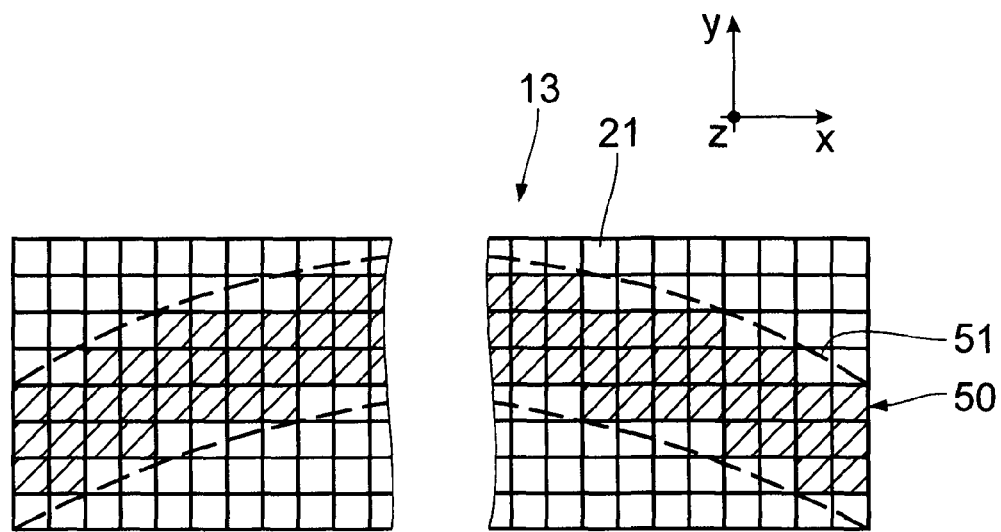
FIG. 16 shows another embodiment of a grouping of the separate mirrors of the field facet mirror according to FIG. 2 for illumination of a ring-shaped or arcuate field.

FIG. 16 shows another alternative version of a grouping of the separate mirrors 21 of the field facet mirror 13. A separate mirror group 50 of the field facet mirror 13 according to FIG. 16 is grouped in such a way that the separate mirror group 50 has an arcuate envelope 51. The envelope 51 is reproduced by selecting corresponding separate mirrors 21. The separate mirror group 50 includes those separate mirrors 21 which are shown hatched in FIG. 16. Correspondingly, the separate mirror group 50 forms an arcuate separate facet for illuminating a correspondingly arcuate or annular object field 5 in the object plane 6. Likewise, a plurality of such separate mirror groups 50 with arcuate or annular envelopes 51 may be formed for illuminating correspondingly formed object fields. As with the other separate mirror groupings explained above, the number of separate facets 21 the field facet mirror 13 needs to be provided with depends on the one hand on the desired number of separate mirror groups and on the other on the desired resolution for reproducing a desired envelope, for instance the envelope 51, via the raster pattern or the tiling of the separate mirrors 21.

FIGS. 17 to 20 show various examples of arrangements or configurations of separate mirror groups or separate facets 19 of the field facet mirror 13. As described above with reference to FIGS. 2 to 16, each of these separate mirror groups 19 is in turn divided into a plurality of separate mirrors 21 which are not shown in detail. Each of the groupings which are shown in FIGS. 17 to 20 can be generated by one and the same field facet mirror 13. The Figures show in each case only the separate mirror groups 19; the separate mirrors on the other hand, which are provided between these groups but are not in use, are not shown.

Figure 17:
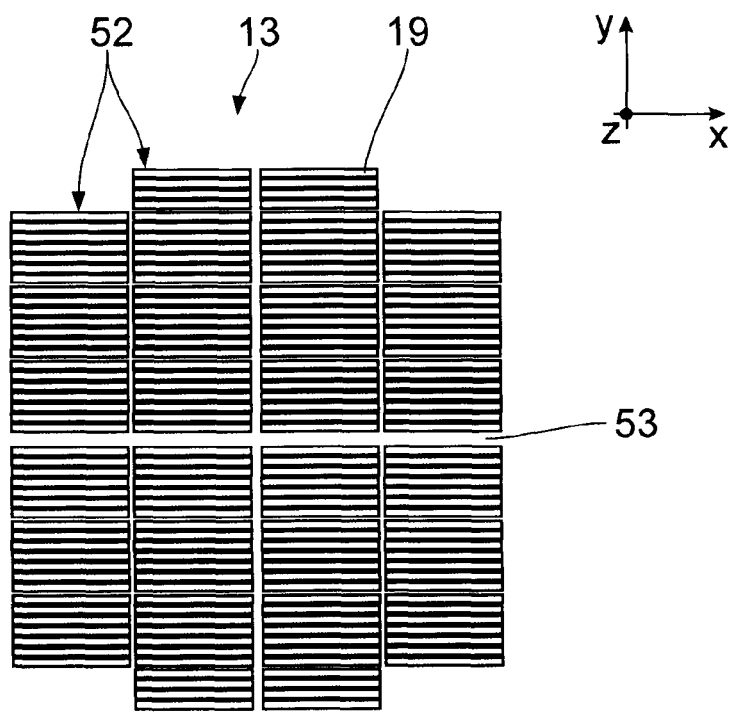
FIGS. 17 to 20 show further examples of separate mirrors of a field facet mirror which are grouped into separate mirror groups.

The field facet mirror 13 according to FIG. 17 is grouped into a total of four columns 52 of separate mirror groups 19. The field facet mirror 13 is shaded by upstream components in a central cross-shaped region 53; in this region 53, adjacent separate mirror groups 19 are arranged at a greater distance from each other so that there are no grouped separate mirrors in the region 53.

Figure 18:
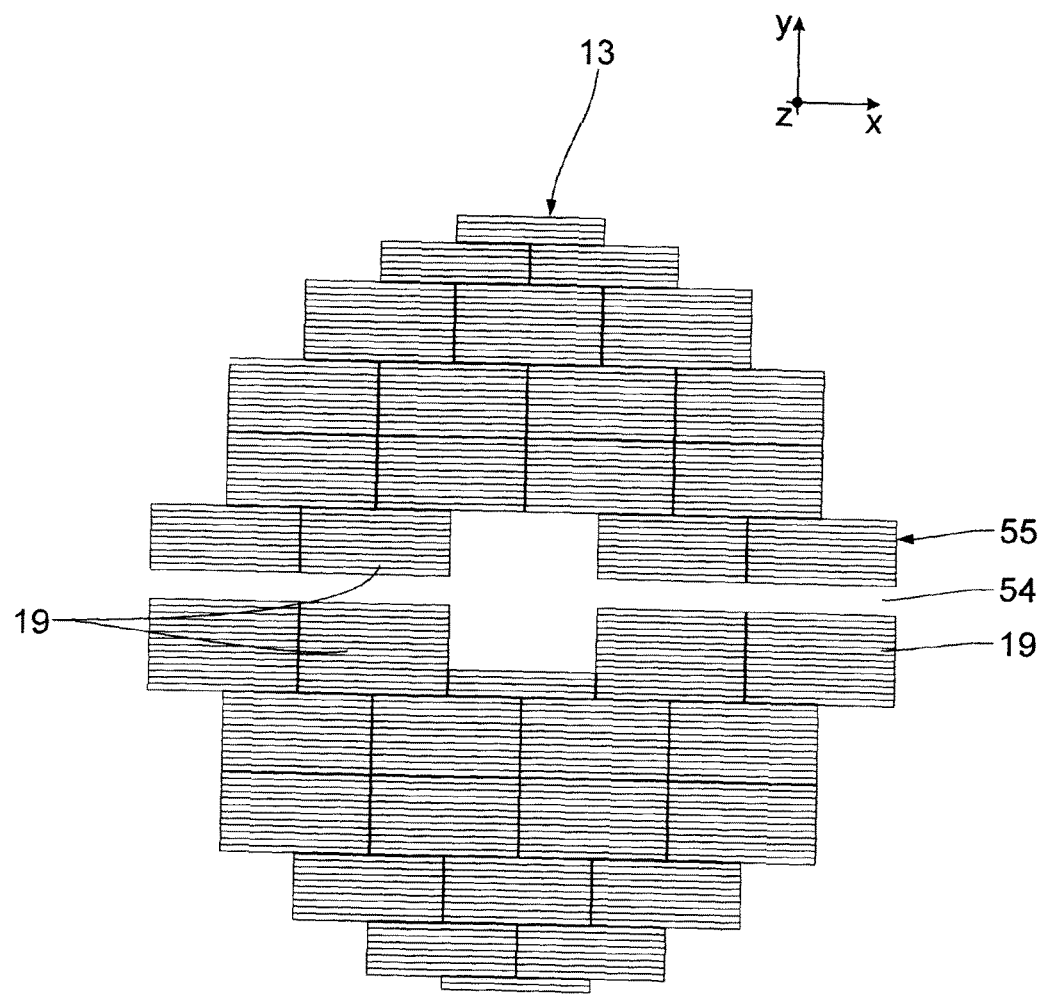

The field facet mirror 13 according to FIG. 18 is grouped in such a way that the separate mirror groups 19, which are in turn composed of a plurality of separate mirrors (not shown), are arranged in columns which are offset relative to each other in the way that is illustrated by the section shown in FIG. 7. In this configuration of the separate mirror groups 19, a horizontal central portion 54 of the field facet mirror 13 that increases in width in the center is not covered with grouped separate mirrors 21. The portion 54 is shaded by components, which are arranged upstream of the field facet mirror 13 according to FIG. 18, as well.

In the field facet mirror 13 according to FIG. 18, the separate mirror groups 19 are arranged in supergroups 55.

Some of the adjacent supergroup rows are offset relative to each other to form a circular envelope of the field facet mirror 13 according to FIG. 18.

The separate mirror groups 19 of the field facet mirror 13 according to FIGS. 17 and 18 have an aspect ratio x/y of 13:1. These separate mirror groups 19 may therefore be formed by 13 adjacent square-shaped separate mirrors 21.

Figure 19:
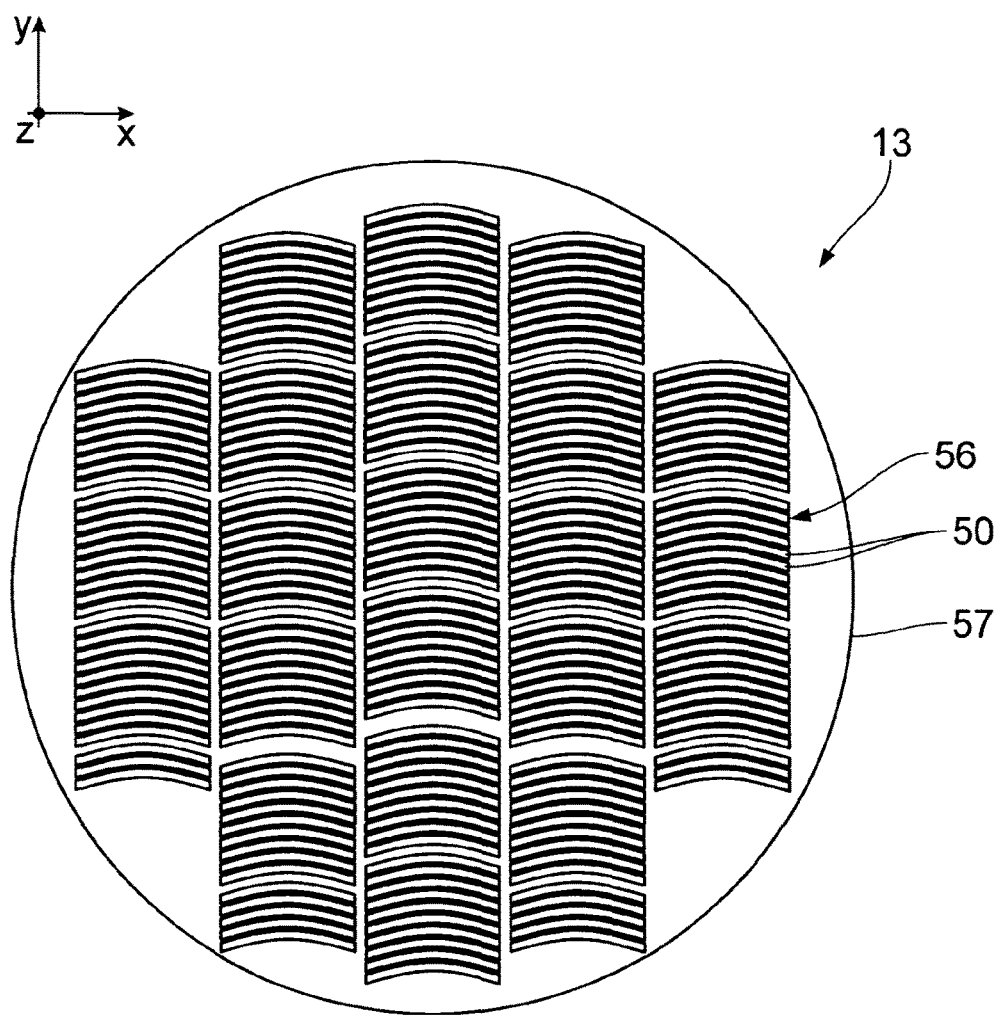

FIG. 19 shows an example of a configuration of a plurality of arcuate or annular separate mirror groups 50, with each separate mirror group 50 corresponding to that which has been described above with reference to FIG. 16. The separate mirror groups 50, in other words the separate facets of the field facet mirror 13 according to FIG. 19, are arranged in supergroups 56 of ten separate mirror groups 50 each which are arranged one above the other in FIG. 19. The supergroups 56 are in turn arranged in five supergroup columns. The supergroups 56 are arranged symmetrically, which allows them to be inscribed in a circular envelope 57.

Figure 20:
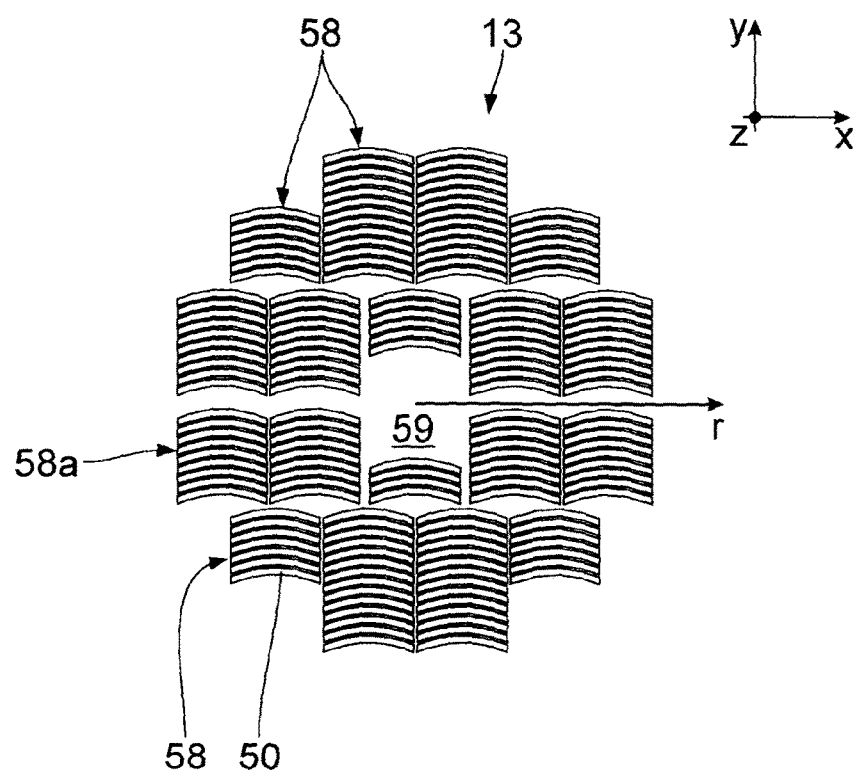

FIG. 20 shows another configuration of the field facet mirror 13 which is divided into arcuate or annular separate mirror groups 50. The separate mirror groups 50 are in turn grouped into supergroups 58 which include in each case a different number of separate mirror groups 50. The supergroup 58a shown on the bottom left of FIG. 20 is for instance divided into nine separate mirror groups 50. Other supergroups 58 have more or less separate mirror groups 50. Due to a central shading formed by the collector 11, a central portion 59 of the field facet mirror 13 is not provided with separate mirror groups 13.

The aspect ratio of the separate mirror groups 50 of the embodiments according to FIGS. 19 and 20 amounts to x/y=13:1 as well, with x referring to the width of one of the separate mirror groups 50 in the x-direction and y referring to the extension thereof in the y-direction.

Figure 21:
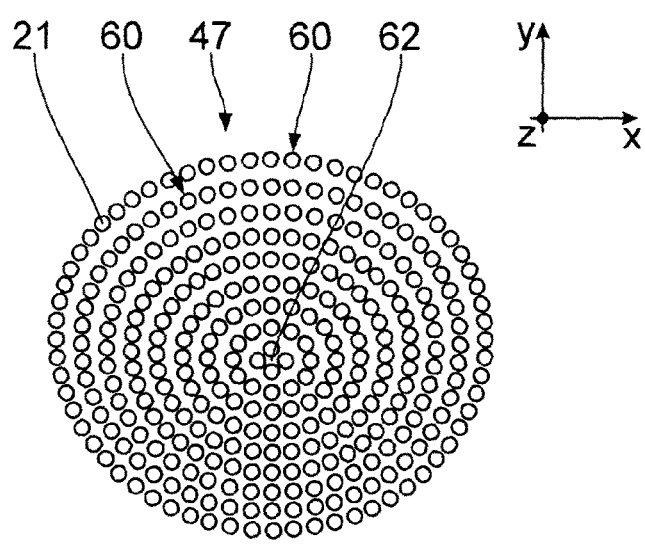
FIGS. 21 and 22 show further examples of separate mirrors of a pupil facet mirror which are grouped into separate mirror groups.
Figure 22:
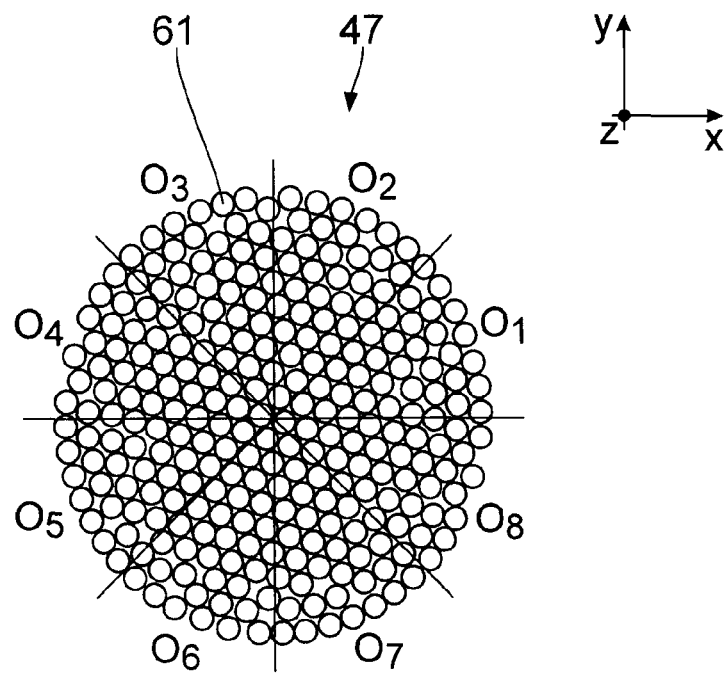

FIGS. 21 and 22 show various divisions of the pupil facet mirror 47 into separate mirror groups 60, 61. Again, the Figures show only the separate mirror groups; the separate mirrors between the grouped separate mirrors are not shown. The divisions according to FIGS. 21 and 22 are achievable using one and the same pupil facet mirror 47.

In the embodiment according to FIG. 21, the pupil facet mirror 47 is divided into separate mirror groups 60 which form a plurality of concentric circles about a central region 62. Each of the separate mirror groups 60 is in turn composed of a plurality of separate mirrors 21 of the pupil facet mirror 47, as explained above with reference to FIGS. 8, 14 and 15. The pupil facet mirror 47 includes a total of more than 100 separate mirror groups 60; in the embodiment according to FIG. 21, the number of separate mirrors 21 amounts to more than 1.000.

The separate mirrors 21 according to FIG. 22 are grouped in such a way that the round separate mirror groups 61 are arranged in an approximate hexagonal-close packing.

The groupings according to FIGS. 21 and 22 have proven to be particularly suitable for forming illumination settings with a given illumination angle distribution. If required, some of the separate mirror groups 60, 61 or supergroups thereof may be blocked out by tilting their upstream separate mirror groups 19 of the field facet mirror 13 for defining a particular illumination setting.

Figure 23:
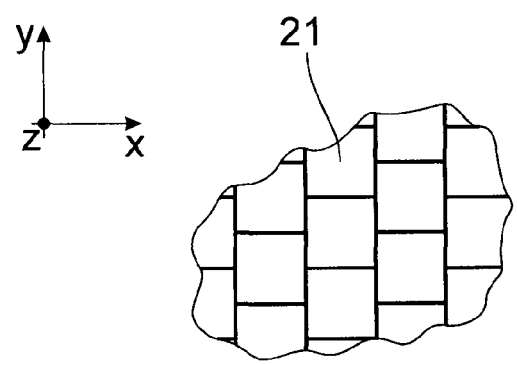
FIG. 23 shows another embodiment of a tiling with separate mirrors disposed on a reflecting surface of a facet mirror which is composed of separate mirrors.

As an alternative to FIG. 2, FIG. 23 shows a tiling of the reflecting surface 20 of one of the above-described facet mirrors which is covered with separate mirrors 21. The separate mirrors 21 of the tiling according to FIG. 23 are square-shaped as well. The separate mirrors 21 are not arranged in a raster pattern of rows and columns but adjacent columns are offset relative to each other by half an edge length of the separate mirrors 21.

The tiling according to FIG. 23 allows arcuate or annular separate mirror groups, for instance the separate mirror groups 50 according to FIGS. 19 and 20, to be formed with low losses next to the envelope 51, which involves a lower separate mirror or pixel resolution at a given maximum allowable loss than a tiling which is arranged in a raster pattern of rows and columns.

Figure 24:
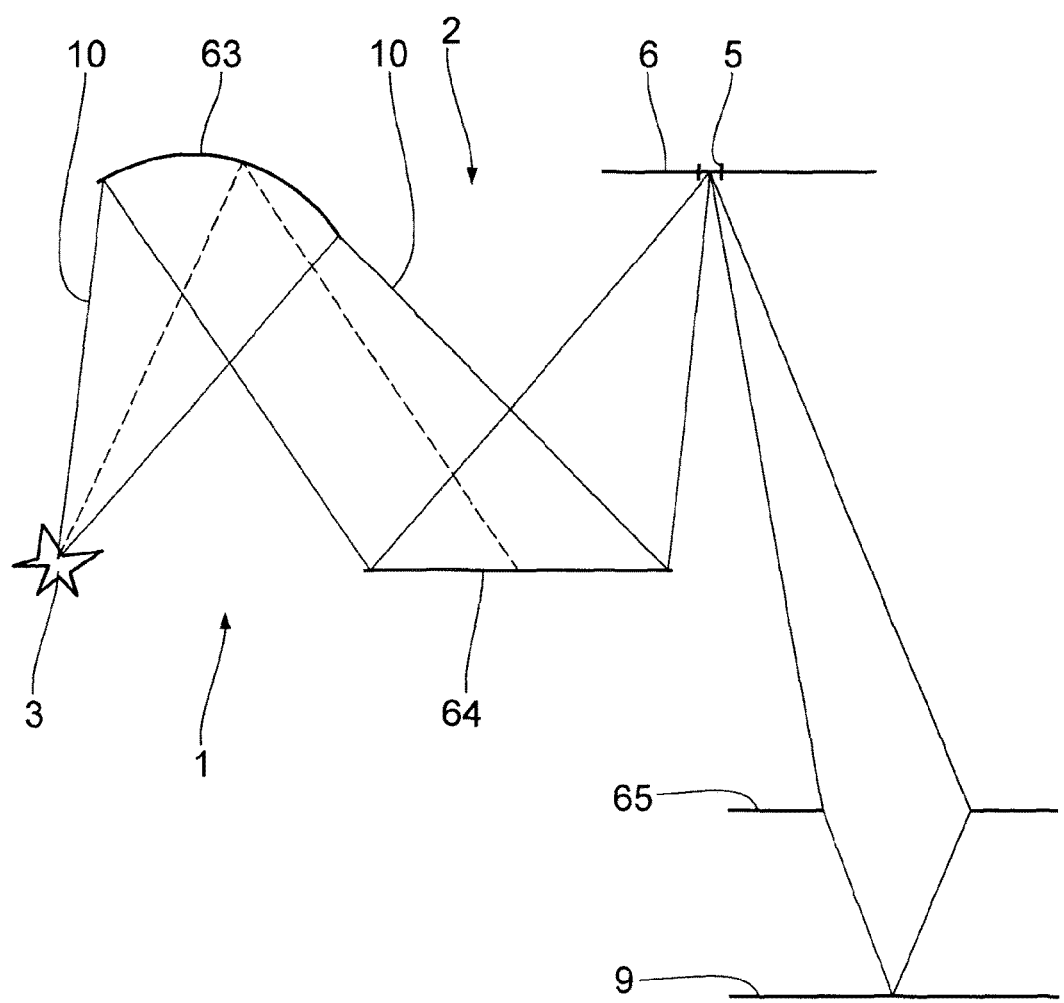
FIG. 24 shows a schematic meridional section through another embodiment of an optical design of a projection exposure apparatus for EUV projection lithography, an illumination optics of the projection exposure apparatus including a specular reflector.

FIG. 24 shows a projection exposure apparatus 1 including an alternative illumination optics. Components which correspond to those which have already been explained above with reference to FIGS. 1 to 23 have the same reference numerals and are not discussed in detail again.

The first element downstream of the radiation source 3 is a bundle-forming collector 63 which otherwise has the function of the collector 11 in the arrangement according to FIG. 1. Downstream of the collector 63 is arranged a specular reflector 64. The specular reflector 64 forms the incident EUV radiation 10 in such a way that the EUV radiation 10 illuminates the object field 5 in the object plane 6, which results in a given, for instance homogeneously illuminated, pupil illumination distribution with a circular boundary, in other words a corresponding illumination setting, in the pupil plane 65 of the projection optics not shown in FIG. 24, the pupil plane 65 being arranged downstream of the reticle. The effect of the specular reflector 65 is described in US 2006/0132747 A1. Like the facet mirrors described above, a reflecting surface of the specular reflector 64 is divided into separate mirrors 21. Depending on the illumination desired properties, these separate mirrors of the specular reflector 64 are grouped into separate mirror groups, in other words into facets of the specular reflector 64.

Figure 25:
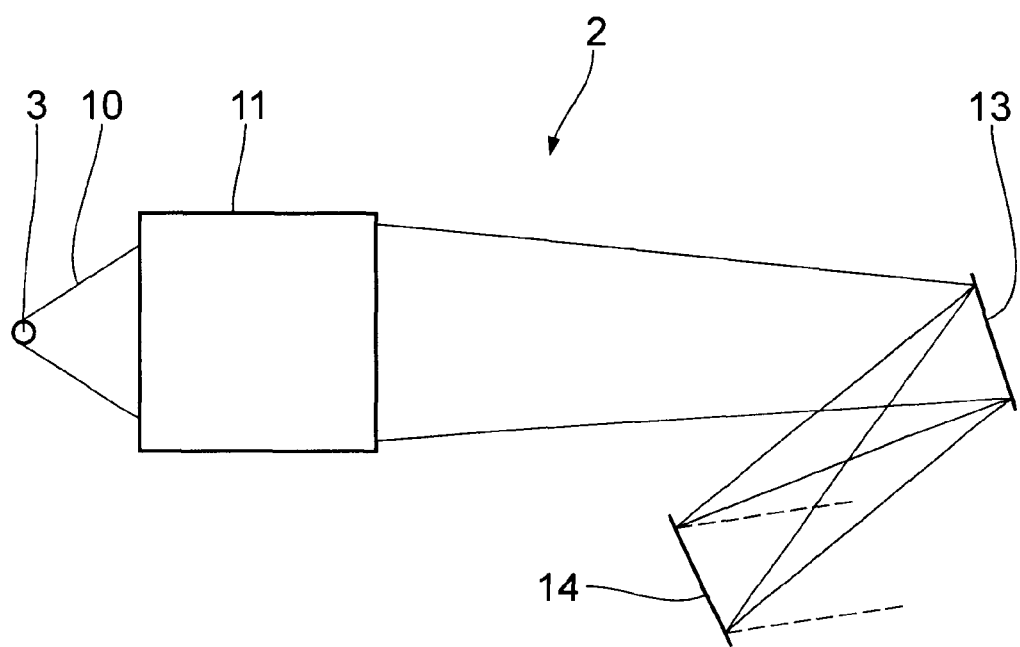
FIG. 25 shows a schematic meridional section through a portion of another embodiment of an illumination system for a projection exposure apparatus for EUV projection lithography.

FIG. 25 shows an alternative illumination of the pupil facet mirror 14 which is different from the illumination according to FIG. 1. Components which correspond to those which have been explained above with reference to FIGS. 1 to 23 have the same reference numerals and are not discussed in detail again. In FIG. 25, the illumination system 2 is shown up to and including the pupil facet mirror 14.

In contrast to the illumination system 2 according to FIG. 1, the illumination system 2 according to FIG. 25 is not provided with an intermediate focal plane between the collector 11 and the field facet mirror 13. The reflecting surfaces of the separate mirror groups of the field facet mirror 13, which are not shown in more detail in FIG. 25, may be plane surfaces.

In one of the various embodiments of separate mirror groups of the field facet mirror 13 described above, the actuation of some of the separate mirrors 21 can be individually different from that of the remaining separate mirrors 21 of this group, in other words they can be taken out of the separate mirror group. Consequently, the various separate facets of the field facet mirror 13 which are thus formed can individually be provided with specific blockings or shadings, which may be useful for correcting the homogeneity of the illumination intensity in the object field 5.

Correspondingly, in one of the above-described various embodiments of separate mirror groups of the pupil facet mirror 14, 47, the actuation of some of the separate mirrors 21 can be individually different from that of the other separate mirrors 21 of this group, in other words they are taken out of the separate mirror group. The various source images (cf. 48 in FIGS. 14 and 15) on the pupil facet mirror 14, 47 can be blocked out individually via specific blockings or shadings. This may be useful for correcting or for setting particular intensity distributions across the illumination angles of the object field 5. Correspondingly, separate facets of separate mirror groups, which are combined on the specular reflector 64, may individually be taken out of the separate mirror group.

Figure 26:
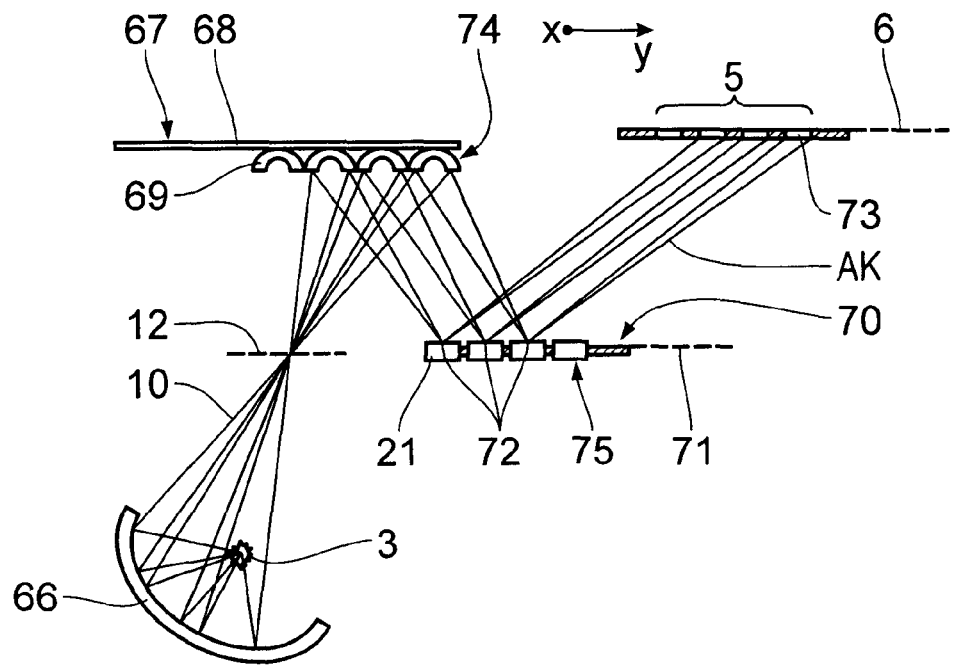
FIG. 26 shows a view similar to FIG. 24 of another embodiment of an optical design of an illumination optics of a projection exposure apparatus for EUV projection lithography including a specular reflector.

FIG. 26 shows another embodiment of an illumination optics. Components and functions which correspond to those that have been explained above with reference to FIGS. 1 to 25 have the same reference numerals and are not discussed in detail again.

The first element downstream of the radiation source 3 is a collector 66 with a continuous mirror surface which is, in other words, not provided with facets. The mirror surface may for instance be an elliptical mirror surface. The collector 66 may be replaced by a nested collector.

Downstream of the intermediate focal plane 12, the EUV radiation 10 impinges upon a collector facet mirror 67. The collector facet mirror 67 has a plane carrier plate 68 which is joined to an x/y array of ellipsoidal separate mirrors 69 that is fastened thereon. The ellipsoidal separate mirrors 69 have closely adjacent reflecting surfaces, causing the largest part of the EUV radiation 10 to be reflected by the ellipsoidal separate mirrors 69 of the collector facet mirror 67. The ellipsoidal separate mirrors 69 are connected to actuators (not shown) which allow the ellipsoidal separate mirrors 69 to be tilted individually. The ellipsoidal separate mirrors 69 are formed in such a way that they all absorb the same solid angle of the EUV radiation 10.

The radiation source 3 is disposed in one focal point of the elliptical collector 66 while the intermediate focus of the intermediate focal plane 12 is disposed in the other focal point thereof.

Downstream of the collector facet mirror 67, a specular reflector 70 is arranged in the beam path of the EUV radiation 10, the specular reflector 70 including an x/y-array of separate mirrors 21. Each ellipsoidal separate mirror 69, which is impinged by the EUV radiation 10, is allocated to one of the separate mirrors 21 of the specular reflector 70 in the subsequent beam path, causing the EUV radiation 10 to be divided into a number of radiation channels corresponding to the number of impinged ellipsoidal separate mirrors 69, with each of these radiation channels impinging upon one of the ellipsoidal separate mirrors 69 and then upon the respectively allocated separate mirror 21 of the specular reflector 70.

Figure 28:
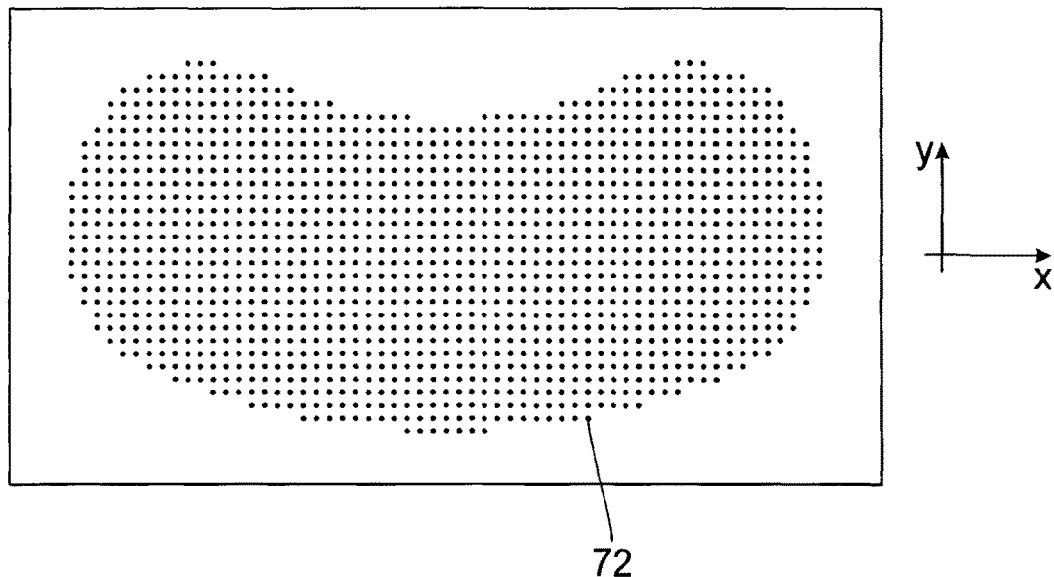
FIG. 28 shows a plan view of source images impinging upon the specular reflector according to FIGS. 26 and 27.

The intermediate focus of the intermediate focal plane 12 is disposed in a respective one of the focal points of one of the ellipsoidal separate mirrors 69 while in the second focal point of the ellipsoidal separate mirror 69 is disposed the separate mirror 21 of the specular reflector 70 which is allocated to the ellipsoidal separate mirror 69. In other words, the specular reflector 70 is disposed in an image plane 71 for source images 72 of the radiation source 3. These source images 72 are discretely arranged in the image plane 71, in other words they are arranged at a distance from each other. This is shown in FIG. 28 which is a plan view of the source images 72 at the location of the specular reflector 70. Corresponding to the number of illuminated separate facets 21 of the specular reflector, there are provided a total of several hundreds of such source images 72 which are arranged in an equidistant x/y raster pattern. An envelope of the total of source images 72 approximately has the shape of a kidney or a bean.

Proceeding from the source images 72 on the specular reflector 70, object field portions 73 of the object field 5 in the object plane 6, in which is arranged the reticle, are illuminated via the individual radiation channels. The object field portions 73 cover the object field 5 in the manner of a generally distorted, rectangular x/y raster pattern.

The object field portions 73 are also referred to as source spots as they are allocated to in each case one source image 72. The illuminated shape of the object field portions 73 is correlated with the boundary shape of the ellipsoidal separate mirrors 69.

The specular reflector 70 is not arranged in a pupil plane of the illumination optics according to FIG. 26.

The object field 5 has a partially annular shape for instance with a slot width of 8 mm in the y-direction and a width of 104 mm in the x-direction. The separate mirrors 21 of the specular reflector 70 form the radiation channels of the EUV radiation in such a way that the object field, which is formed by the object field portions 73, is illuminated in the object plane 6, and that a desired intensity distribution is obtained in a downstream pupil plane of the illumination optics which coincides with a pupil plane of the downstream projection optics, thus ensuring that a desired illumination angle distribution is obtained on the reticle.

FIG. 26 is a schematic outline of a channel-by-channel illumination where adjacent ellipsoidal separate mirrors 69 cause EUV radiation 10 to impinge upon adjacent separate mirrors 21 of the specular reflector 70. Such an adjacent relation is not compulsory. In fact, it may be desired to eliminate such adjacent arrangements so that for instance the proximity relationships of the ellipsoidal separate mirrors 69 on the one hand and the separate mirrors 21 of the specular reflector 70 on the other cannot be transformed into each other through point inversion, mirroring or through an identity function. This is hereinafter also referred to as mixing of proximity relationships which is illustrated in FIG. 27 showing an alternative relation of the ellipsoidal separate mirrors 69 to the separate mirrors 21 of the specular reflector 70.

Figure 27:
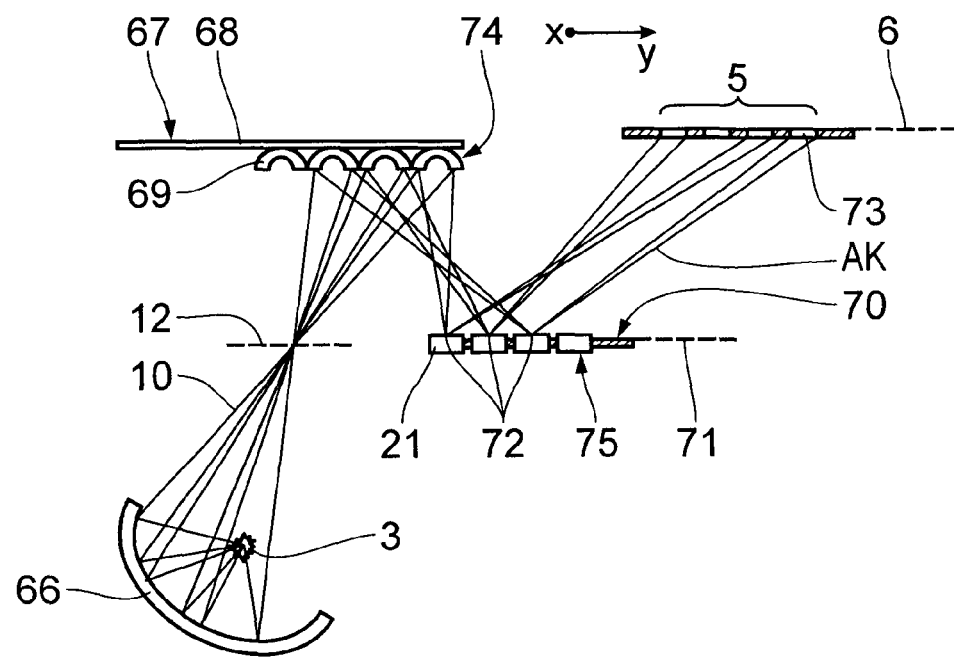
FIG. 27 shows a view similar to FIG. 26 of an alternative version of an allocation of ellipsoidal separate mirrors of a collector facet mirror of the illumination optics to separate mirrors of the specular reflector.

When the proximity relationships are mixed according to FIG. 27, this results in a corresponding mixed illumination of the object field portions 73 by the specular reflector 70, which allows the object field 5 to be illuminated with good homogeneity. This reduces the effects on the homogeneity of the object field illumination which are due to changes of the emission properties of the radiation source 3 or changes, in particular across the surface, of the reflectivities of optical systems arranged upstream of the specular reflector 70 for instance as a result of selective contamination of the mirror surfaces.

A mixed allocation of the ellipsoidal separate mirrors 69 to the separate mirrors 21 of the specular reflector 70 may for instance take place using algorithms which are disclosed in U.S. Pat. No. 6,438,199 B1. This allocation may for instance be cross-wise, with the result that adjacent separate mirrors 21 of the specular reflector 70 are impinged with light from nonadjacent ellipsoidal separate mirrors 69.

The number of separate mirrors 21 of the specular reflector 70 exceeds the number of ellipsoidal separate mirrors 69 of the collector facet mirror 67. In this way, the actuators of the ellipsoidal separate mirrors 69 can be actuated in such a way that various subgroups of the separate mirrors 21 of the specular reflector 70 are adjusted to achieve various desired illuminations of the object field 5. Each of the source images 72 may be generated on exactly one of the separate mirrors 21.

The separate mirrors 21 of the specular reflector 70 are in each case connected to actuators as well, which allows them to be individually tilted relative to the image plane 71. After adjusting the ellipsoidal separate mirrors 69, this enables one to accordingly readjust the separate mirrors 21 of the specular reflector 70.

FIGS. 26 and 27 show a schematic view of a group 74 of ellipsoidal separate mirrors 69 which extend along the y-direction and are allocated to a group 75 of separate mirrors 21 of the specular reflector 70 and to a group of object field points 73, the group 75 of separate mirrors 21 and the group of object field points 73 extending along the y-direction as well.

The actuators of the collector facet mirror 67 on the one hand and the specular reflector 70 on the other are actuable in such a way that the ellipsoidal separate mirrors 69 or the separate mirrors 21 of the specular reflector 70 are actuable in groups. Such an actuation of particular groups is however not compulsory.

The collector facet mirror 67 may be assembled from ellipsoidal separate mirrors 69 which are prefabricated separately. Another method of producing the collector facet mirror 67 allows the collector facet mirror 67 to be formed monolithically, for instance through single-diamond processing. The collector facet mirror 67 is then smoothed out via HSQ or polyamide spin-coating. The HSQ method is described in Farhad Salmassi et al., Applied Optics, Volume 45, no. 11, p. 2404 to 2408.

Another method of producing the collector facet mirror 67 allows the collector facet mirror 67 to be galvanically formed from a base body via electroplating.

The radiation source 3, the collector 66 and the collector facet mirror 67 may be integrated in a multisource array. A multisource array of this type is described in German patent application no. 10 2007 008 702.2, the entire contents of which are incorporated herein by reference. In the region to be illuminated, in other words in the object field, each radiation source of the multisource array is only able to illuminate a partial region, in other words an object field portion.

The ellipsoidal separate mirror 69, or if the separate mirrors 21 are curved, even the separate mirrors 21 of the embodiments explained above, may in turn be configured of a plurality of plane micro mirrors, with the plurality of plane surfaces approximating the respective curved surface of the ellipsoidal separate mirror 69 or of the curved separate mirror 21 in such a way as to resemble a polyhedron.

Generally, the micro mirrors, which approximate the curved surfaces of the ellipsoidal separate mirrors 69 or of the curved separate mirrors 21, may in turn be displaceable via actuators. In this case, the micro mirrors may be used to influence the imaging properties of the separate mirrors 69, 21.

Micro mirrors of this type may for instance be designed like a micro mirror array (MMA) in which the separate mirrors are movably mounted using laterally attached spring joints, and which are actuable electrostatically. Micro mirror arrays of this type, which are for instance disclosed in EP 1 289 273 A1, are known to those skilled in the art as "MEMS" (Micro-electromechanical systems).

In the embodiments described above, the separate mirrors 21 and 69 provide illumination channels for superimposing the EUV radiation 10, in other words the illumination light, in the object field 5 of the projection exposure apparatus 1. Such illumination channels AK are illustrated schematically in FIGS. 26 and 27. Corresponding illumination channels are also found in the embodiments according to FIGS. 1 to 25. The separate mirrors 21 and 69 have mirror surfaces with such an extension that these separate-mirror illumination channels illuminate object portions in the object field 5 which are smaller than the object field 5. This is schematically shown in FIGS. 26 and 27 for the specular reflector 70. This illumination of the object field 5 by assembling object field portions which are allocated to different separate-mirror illumination channels is generally also applicable in the embodiments according to FIGS. 1 to 25.

Figure 29:
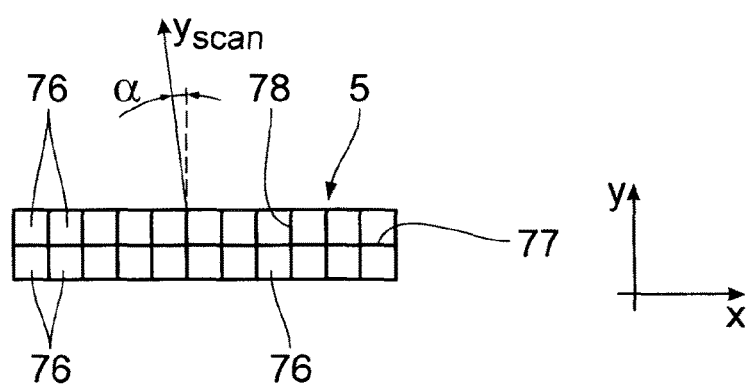
FIG. 29 shows a plan view of a partially illuminated object field of an alternative embodiment of the projection exposure apparatus.
Figure 30:
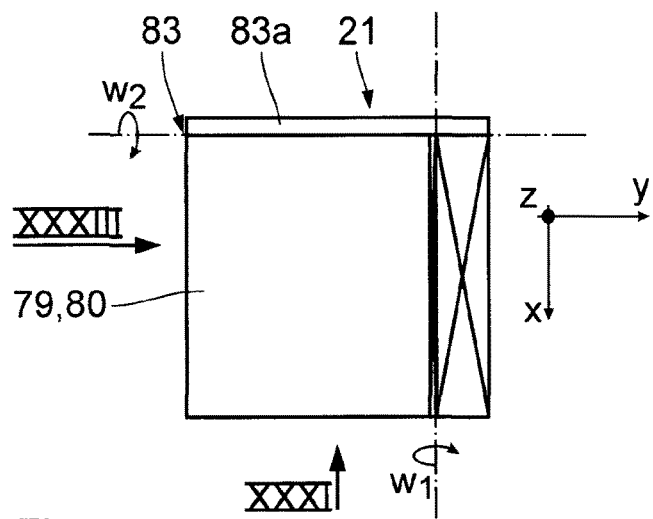
FIG. 30 shows a plan view of a separate mirror for use in the field facet mirror according to FIG. 2.

FIG. 29 is a schematic view of an exemplary object field 5 which is illuminated by a total of twenty-two illumination channels, with the illumination channels illuminating a corresponding number of twenty-two object field portions 76. Boundaries 77, 78 between the object field portions 76 extend in the x-direction or in the y-direction, respectively.

A scanning direction $y_{scan}$, in which the wafer holder and the reticle holder are synchronously displaced during the projection exposure using the projection exposure apparatus 1 with the object field illumination according to FIG. 29, is not exactly parallel to the y-direction, in other words it is not perpendicular to the long field axis x of the object field 5, but is tilted relative to the field axis x through an angle $\alpha$. Consequently, when scanned through the object field 5, a point on the reticle sees, if at all, one of the boundaries 78, which extend in y-direction and between two object field portions 76, only during a part of the scanning process. This prevents points on the reticle to be imaged from moving along one of the boundaries 78 all the time during the entire scanning process through the object field 5, which improves the homogeneity of the intensity the points on the reticle to be imaged are exposed to when the object field is partially illuminated.

Alternatively, the object field portions may be arranged in such a way that there are no continuous boundaries between the object field points along a scanning direction. Such an arrangement of superimposed object field portions which are offset relative to each other is for instance obtained if the object field 5, corresponding to an arrangement according to FIG. 23 which is rotated through 90°, is illuminated using object field portions which correspond to the separate facets 21 according to FIG. 23. In this case, there are rows of object field portions which are offset relative to each other perpendicular to the scanning direction, with the result that even if the scanning direction $y_{scan}$ coincides exactly with the y-direction, there is no single point on the reticle which moves along a boundary between object field portions all the time when scanned through the object field 5. Therefore, an offset arrangement of this type also helps to avoid unwanted inhomogeneities of the intensity to which the field points are exposed during the scanning process.

A corresponding homogenization may be obtained if the object field portions have boundary shapes with edges that are not parallel to the scanning direction. This may be for instance be achieved by trapezoidal or rhombic separate mirrors 21 whose shape defines the shape of the object field portions.

In order to prevent sharp edges of the separate mirrors 21, 69 from being imaged into the image field, which would lead to unwanted intensity inhomogeneities in the image field 8, a specific defocusing of the images of the separate mirrors 21, 69 or a specific aberration of the mirror image is achievable using the transmission optics 15. To this end, the transmission optics 15 may be configured in such a way that sharp edges of the images of the separate mirrors 21, 69 are generated upstream or downstream of the object plane 6.

The separate mirrors 21, 69 may have a multilayer coating including separate layers of molybdenum and silicon in order to optimize the reflectivity of the separate mirrors 21, 69 for the EUV wavelength that is used.

In the case of a pupil facet mirror including pupil facets which are not divided into separate mirrors, the separate-mirror illumination channels may be transmitted to the object field 5 in groups by one and the same pupil facet. Each of these pupil facets defines a group illumination channel which combines the separate-mirror illumination channels allocated to this pupil facet. The number of group illumination channels then corresponds to the number of pupil facets which are not divided into separate mirrors. Corresponding to the division of the group illumination channel into separate-mirror illumination channels, each of these pupil facets and each group illumination channel is then allocated to a number of separate mirrors of the field facet mirror. In order to modify illumination angle distributions, the number of the pupil facets may exceed the number of the group illumination channels.

In the embodiments where both the field facet mirror and the pupil facet mirror are divided into separate mirrors 21, adjacent separate mirrors 21 of the field facet mirror need not be transmitted via adjacent pupil facet separate mirrors (compare the above descriptions of the specular reflector according to FIGS. 26 and 27); in fact, groups of field-facet separate mirrors and pupil-facet separate mirrors may be provided which are randomly mixed in space for combined illumination of the entire object field 5.

The following is a more detailed description of an embodiment of a separate mirror, for instance one of the separate mirrors 21 which forms the field facet mirror 13 according to FIG. 2, via FIGS. 30 to 34. Components which correspond to those that have already been explained above with reference to FIGS. 1 to 29 have the same reference numerals and are not discussed in detail again.

The separate mirror 21 according to FIGS. 31 to 34 has a mirror body 79 in the form of a mirror plate. The mirror body 79 consists of silicon. The mirror body 79 has a rectangular reflecting surface 80, which is approximately square-shaped in the embodiment according to FIGS. 30 to 34, for reflecting the EUV radiation 10. The reflecting surface 80 may be provided with a multilayer reflecting coating for optimizing the reflectivity of the separate mirror 21 for EUV radiation 10.

The mirror body 79 of the separate mirror 21 is tiltable about two tilt axes relative to a rigid carrier body consisting of silicon. These two tilt axes are denoted by $w_1$ and $w_2$ in FIGS. 30 to 34. Each of these two tilt axes $w_1$, $w_2$ is part of a tilt joint 82, 83 which is in each case a solid joint. The two tilt axes $w_1$, $w_2$ are perpendicular to each other. The tilt axis $w_1$ is parallel to the x-axis while the tilt axis $w_2$ is parallel to the y-axis. The mirror body 70 and the carrier body 81 may also be formed of $FiO_2$ or $Fi_3N_4$. The tilt axis $w_2$ is disposed in the extension plane of the mirror body 79. Next to the actual reflecting surface 80 of the mirror body 79, there is a small dead surface area 83a which is not tiltable, the dead surface area 83a being shown in FIG. 30 above the tilt axis $w_2$. Both of the two tilt axes $w_1$, $w_2$ extend parallel to the plane of the reflecting surface 80. Alternatively, the tilt joints 82, 83 may also be arranged in such a way that at least one of the two tilt axes $w_1$, $w_2$ is disposed in the plane of the reflecting surface 80.

Other examples of EUV and high-vacuum compatible materials, which are suitable for forming the separate mirror 21, include CVD (chemical vapor deposition) diamond, SiC (silicon carbide), $SiO_2$ (silicon oxide), $Al_2O_3$, copper, nickel, aluminum alloys and molybdenum.

Figure 32:
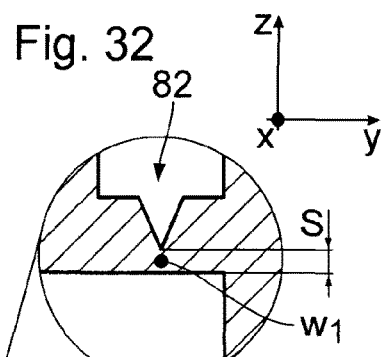
FIG. 32 shows an enlarged sectional view of FIG. 31.
Figure 31:
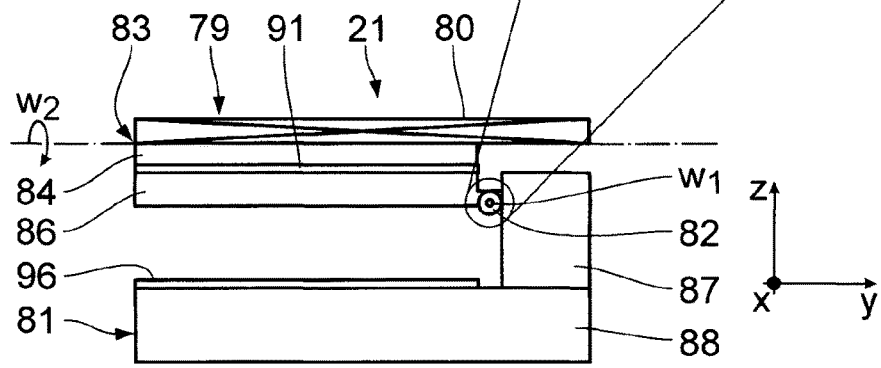
FIG. 31 shows a view of the separate mirror from direction XXXI in FIG. 30, a reflecting surface of the separate mirror being shown in an untilted neutral position.
Figure 33:
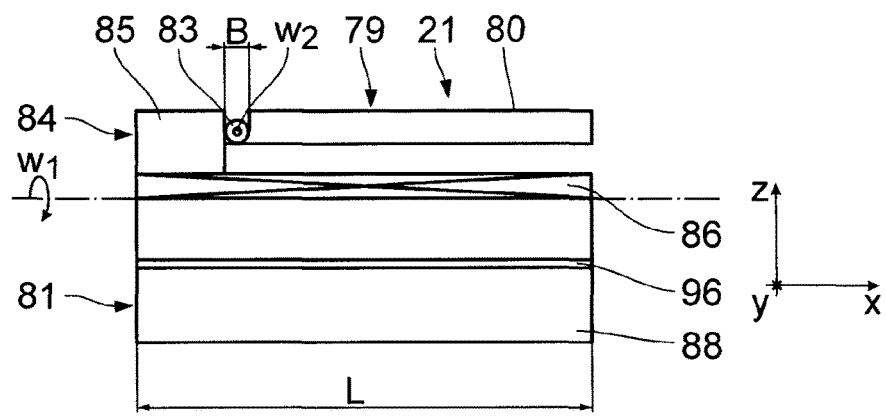
FIG. 33 shows a view of the separate mirror from direction XXXII in FIG. 30.

FIG. 32 shows an enlarged view of the tilt joint 82 of the tilt axis $w_1$. The tilt joint 83 is formed correspondingly.

Perpendicular to the tilt axis $w_1$, in other words in the z-direction of FIG. 32, the tilt joint 82 has a joint thickness S. Along the tilt axis $w_1$, in other words in the x-direction of FIG. 32, the tilt joint 82 has a joint length L (cf. FIG. 33). The size of the joint length L is comparable with a transverse extension of the mirror body 79.

In the separate mirror 21 according to FIGS. 30 to 34, the joint length L amounts to approximately 1 mm. The joint thickness S, which is excessively large in the drawing, amounts to 1 μm. In the separate mirror 21 according to FIGS. 30 to 34, the quotient L/S therefore amounts to approximately 1000.

The mirror body 79 is connected in one piece with an intermediate carrier body 84 via the tilt joint 83 whose dimensions, in particular the joint thickness S and the joint length L thereof, correspond to those of the tilt joint 82. The intermediate carrier body 84 also consists of silicon. According to the cross-section of FIG. 33, the intermediate carrier body 84 is L-shaped and has a joint portion 85 which is directly adjacent to the tilt joint 83, and a plate portion 86 which is arranged below the mirror body 79, in other words on the side of the mirror body 79 remote from the reflecting surface 80. In the region of the tilt joint 83, there is a distance B between the mirror body 79 and the joint portion 85 of the intermediate carrier body 84, which distance B is also referred to as width of the tilt joint 83.

The plate portion 86 of the intermediate carrier body 84 is connected in one piece with a joint portion 87 of the carrier body 81 via the tilt joint 82. The joint portion 87 is fastened to a plate portion 88 of the carrier body 81. The plate portion 88 of the carrier body 81 is arranged below the plate portion 86 of the intermediate carrier body 84. In the neutral position shown in FIGS. 31 and 33, the mirror body 79, the plate portion 86 of the intermediate carrier body 84 and the plate portion 88 of the carrier body 81 are parallel to each other.

Figure 34:
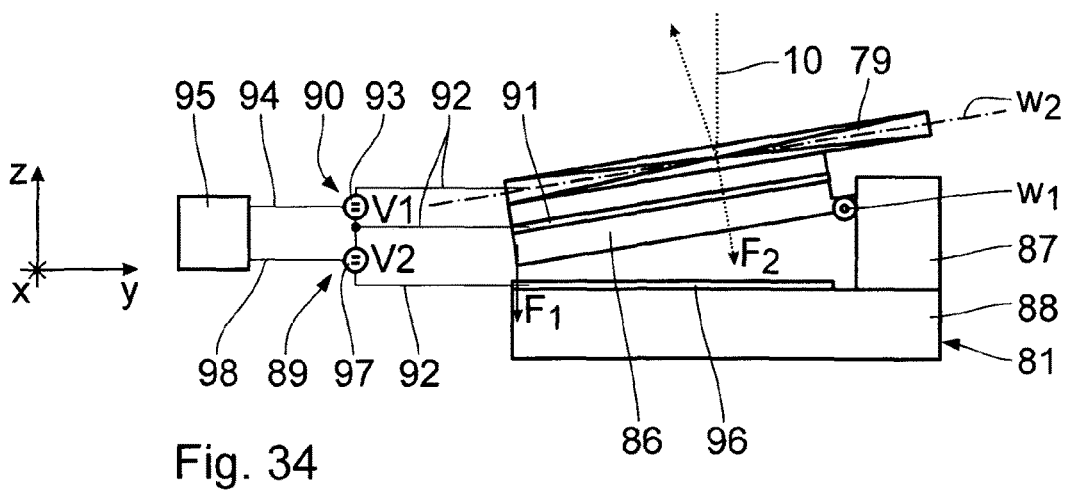
FIG. 34 shows a view similar to FIG. 31 of the separate mirror in a tilted position by way of an actuator.

Two electrode actuators 89, 90 are provided for controlled tilting of the mirror body 79 about the two tilt axes $x_1$, $x_2$ (cf. FIG. 34). The electrode actuator 89 is allocated to the tilt joint 82 and is therefore also referred to as $w_1$-actuator 90. The electrode actuator 90 is allocated to the tilt joint 83 and is therefore also referred to as $w_2$-actuator. The first electrode of the $w_2$-actuator is the mirror body 79 itself which is electrically conductive. A counter electrode 91 of the $w_2$-actuator 90 is a conductive coating that is applied to the plate portion 86 of the intermediate carrier body 84, the coating facing the mirror body 79. In the neutral position of the separate mirror 21, the counter electrode 79 has a distance from the mirror body 79 of approximately 100 μm.

The two electrodes 90, 91 of the $w_2$-actuator are connected to an actuable voltage source 93 via signal lines 92. The voltage source 93 is connected to an actuator control device 95 via a signal line 94.

The counter electrode 91 is at the same time an electrode of the $w_1$-actuator 89. A counter electrode 96 of the $w_1$-actuator 89 is formed by a conductive coating that is applied to the plate portion 88 of the carrier body 81. The counter electrode 96 of the $w_1$-actuator 89 is arranged on the side of the plate portion 88 of the carrier body 81 facing the plate portion 86 of the intermediate carrier body 84. In the neutral position, in other words in a forcefree state, the distance of the counter electrode 96 of the $w_1$-actuator 89 from the plate portion 86 of the intermediate carrier body 84 amounts to 100 μm.

The electrodes 91, 96 are electrically connected to another voltage source 97 via signal lines 92. The voltage source 97 is connected to the actuator control device 95 via another control line 98.

When direct voltages V1 and V2 (cf. FIG. 34) are applied, the plate portion 86 of the intermediate carrier body 84 is controllably tiltable about the tilt axis $w_1$ towards the plate portion 88 of the carrier body 81, and the mirror body 79 is controllably tiltable about the tilt axis $w_2$ relative to the plate portion 86 of the intermediate carrier body 84 through in each case a given tilt angle. The modulus of the tilt angle about the respective tilt axis $w_1$, $w_2$ depends, among other things, on the dimensions of the tilt joints 82, 83, on the surface area of the electrodes 90, 91, 96, on their distance from each other, and of course on the magnitude of the applied voltages V1, V2. The applied voltages V1, V2 allow the tilt angle to be continuously adjusted about the two tilt axes $w_1$, $w_2$.

FIG. 34 shows a tilted position in which the plate portion 86 of the intermediate carrier body 84 has been tilted relative to and towards the plate portion 88 of the carrier body 81 about the tilt axis $w_1$ on the one hand, and the mirror body 79 has been tilted relative to and towards the plate portion 86 of the intermediate carrier body 84 about the tilt axis $w_2$ on the other after applying the voltages V1, V2. Incident EUV radiation 10 is deflected by the reflecting surface 80 of the mirror body 79 in a defined manner, as outlined in FIG. 34.

Figure 35:
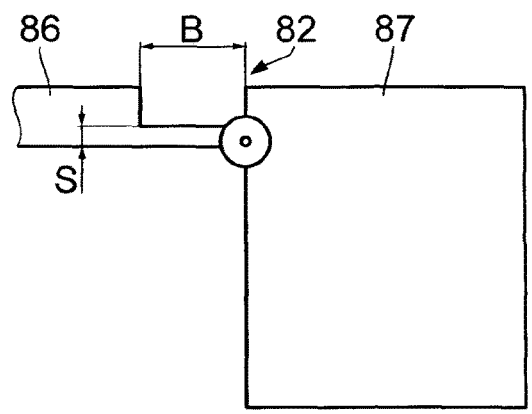
FIG. 35 shows a sectional view of a tilt joint of the separate mirror according to FIGS. 30 to 34, the tilt joint being a solid joint.

FIG. 35 is an alternative view of FIG. 32, showing the dimensional relationships in an embodiment of the tilt joint 82. In this embodiment, a joint thickness S also amounts to approximately 1 µm, a joint width B to approximately 20 and a joint length L, which is perpendicular to the drawing plane of FIG. 35, amounts to approximately 1 mm.

Figure 36:
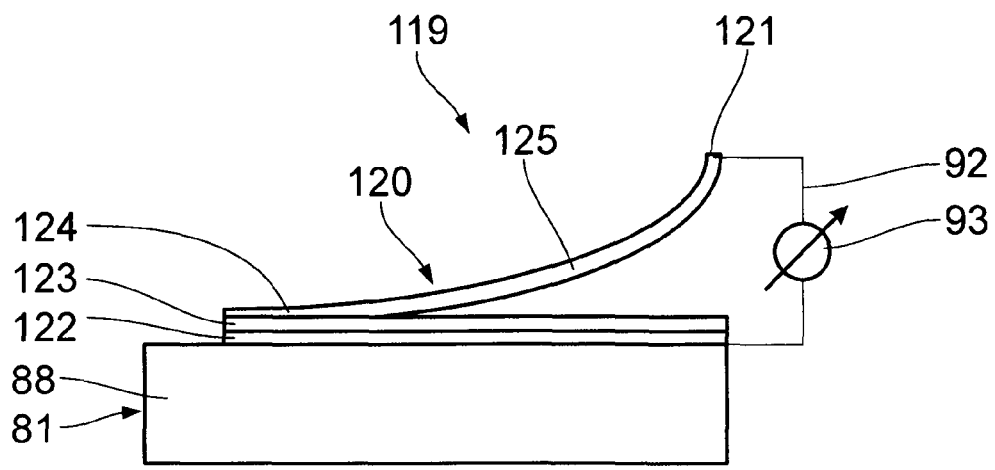
FIG. 36 shows a schematic view of an embodiment of an electrostatic capacitive actuator for controlled tilting of a mirror body of the separate mirrors according to FIGS. 30 to 34, with no voltage being applied between two electrodes of the actuator.
Figure 37:
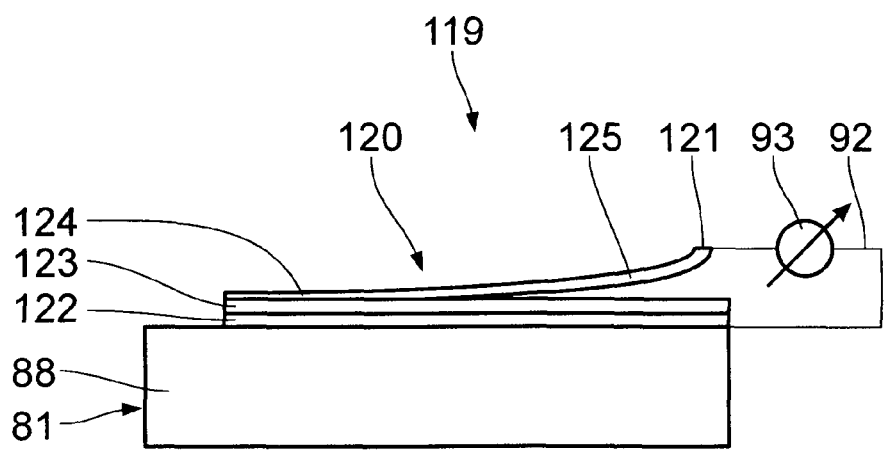
FIG. 37 shows the actuator according to FIG. 36, with a voltage being applied between the two electrodes thereof.

FIGS. 36 and 37 show another embodiment of an actuator 119 for controlled tilting of the reflecting surface 80 of for instance the individual mirror 21 about the at least one tilt axis $w_1$, $w_2$. Components which correspond to those that have already been explained above with reference to FIGS. 30 to 35 have the same reference numerals and are not discussed in detail again.

The actuator 119 has a movable electrode 120 whose free end 121 (cf. FIGS. 36 and 37) is provided with a tilt joint which is allocated to the actuator 119 so as to establish a movable connection with a joint body which is not shown in FIGS. 36 and 37. The movable electrode 120 is flat and shown in cross-section in FIGS. 36 and 37. In the cross-sectional view according to FIGS. 36 and 37, the movable electrode 120 is curved.

A counter electrode 22 of the actuator 119 is rigidly connected with the plate portion 88 of the carrier body 81. The counter electrode 122 is for instance a coating that is applied to the plate portion 88 of the carrier body 81. Between the movable electrode 120 and the counter electrode 122 is arranged a layer in the form of a dielectric 123. The dielectric 123 may be a flat coating on the counter electrode 122.

The counter electrode 122 is in direct contact with the movable electrode 120 in a contact region 124. A distance region 125 of the movable electrode 120 is spaced from the counter electrode 122 and from the dielectric 123. The free end 121 of the movable electrode 120 is part of the distance region 125.

FIGS. 36 and 37 show two positions of the movable electrode 120. FIG. 36 shows a neutral position in which no voltage is applied between the two electrodes 120, 122. The free end 121 of the movable electrode 120 is then disposed at a maximum distance from the plate portion 88. FIG. 37 shows the position in which a tilting voltage of approximately 80 V is applied between the electrodes 120, 122.

In this tilted position according to FIG. 37, a region of the movable electrode 120 next to the contact region 124 also comes into contact with the dielectric 123, causing the distance of the free end 121 from the plate portion 88 of the carrier body 81 to reduce accordingly.

Such actuators 119 according to FIGS. 36 and 37 are also referred to as micro-scroll drives.

Other embodiments of tilt joints may have a different dimensional relationship of the joint length L to the joint thickness S. L/S may be larger than 50, larger than 100, larger than 250 or even larger than 500. An L/S relationship of larger than 1000 is conceivable as well.

The above explained actuators for tilting the mirror body 79 may include an integrated sensor for measuring the respective tilt angle about the tilt axes $w_1$, $w_2$. This sensor may in particular be used for monitoring the pre-set tilting angle.

Figure 38:
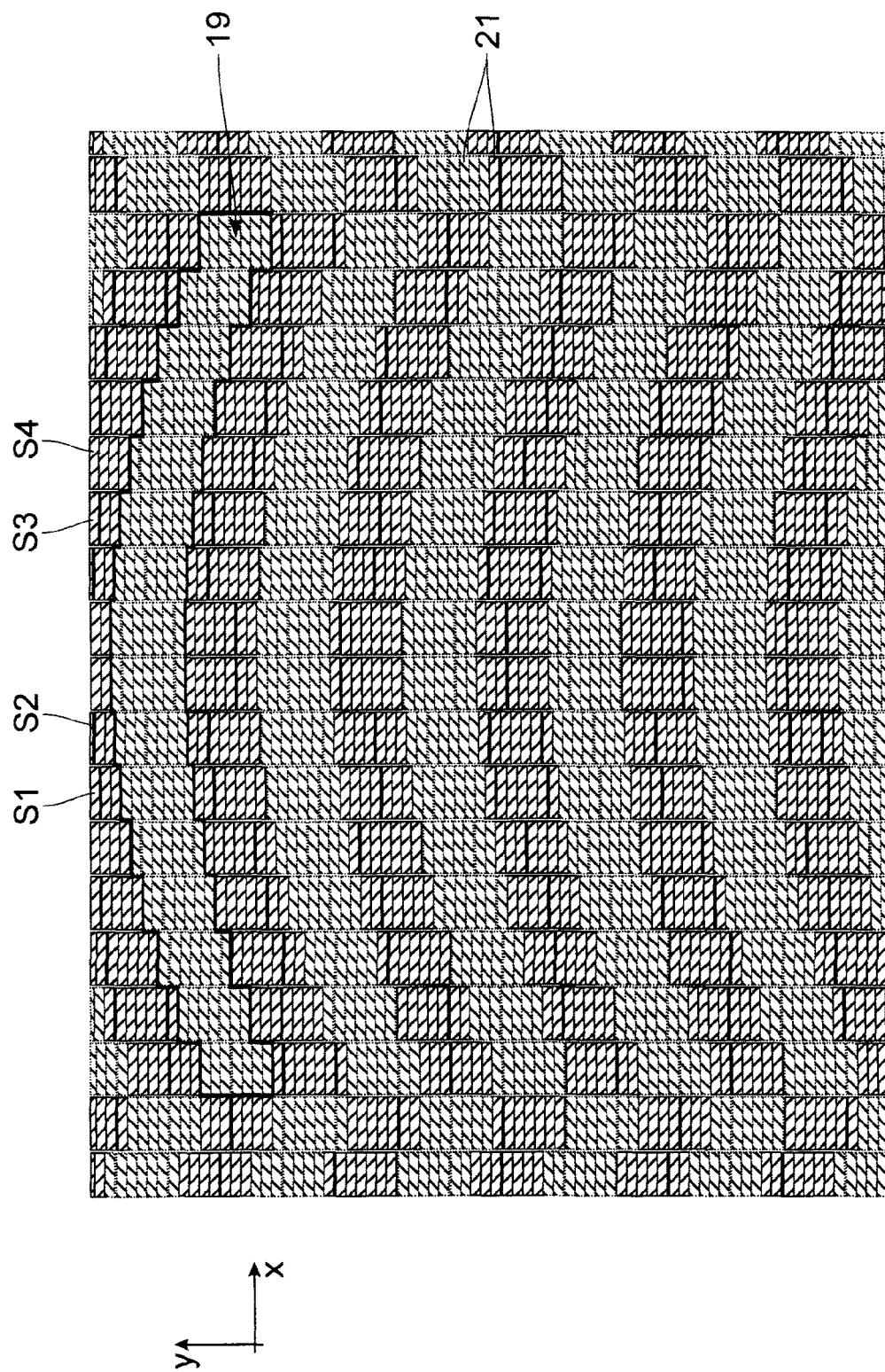
FIGS. 38 and 39 show further embodiments of tilings on a reflecting surface of a facet mirror which is composed of separate mirrors.
Figure 39:
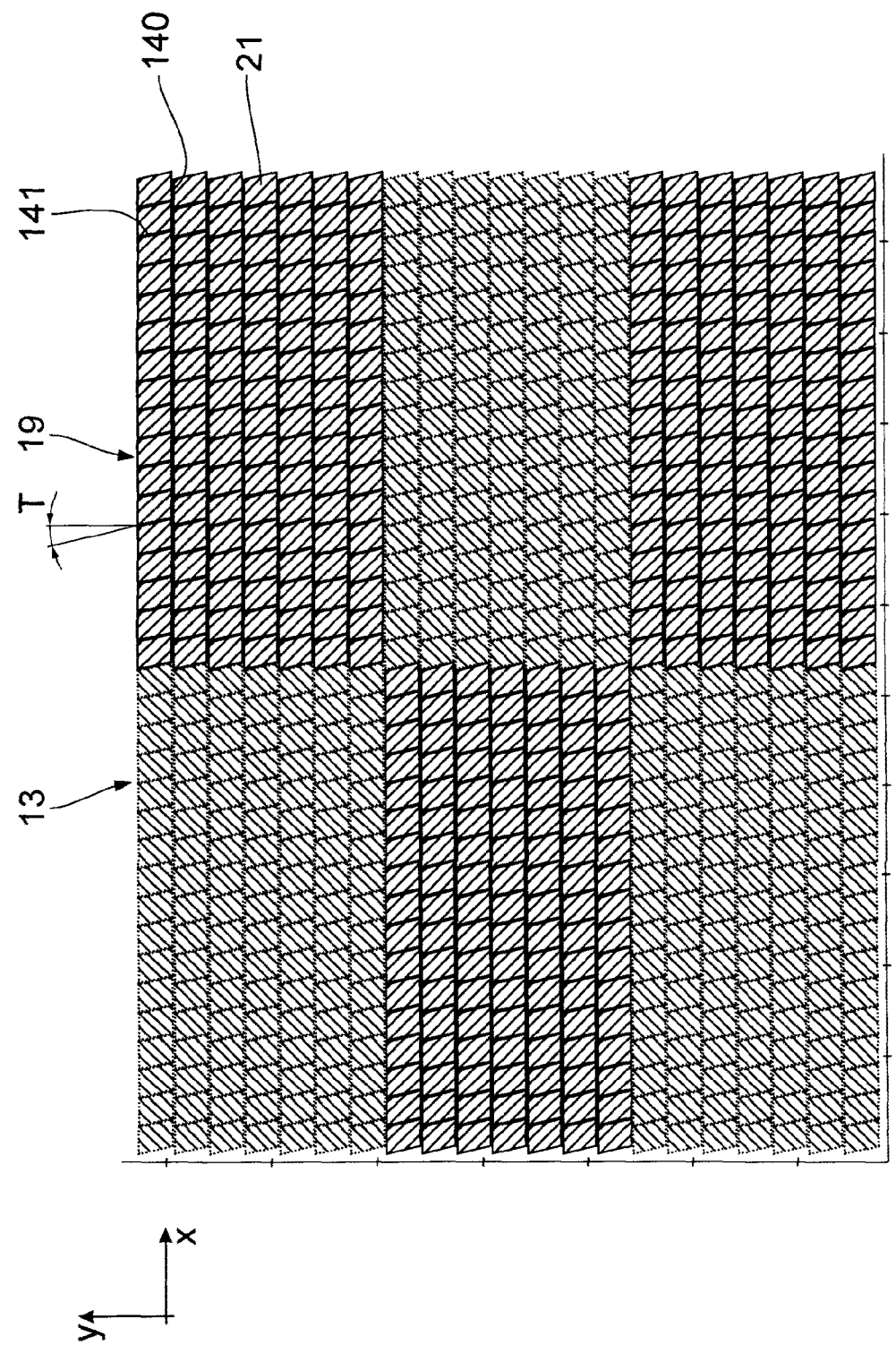

FIGS. 38 and 39 shows further embodiments of tilings on the reflecting surface 20 of one of the facet mirrors described above including separate mirrors 21.

In the tiling according to FIG. 38, the separate mirrors 21 of adjacent columns are offset relative to each other in the y-direction. This is illustrated in FIG. 38 via two columns 51 and S2. Adjacent separate mirrors 21 of a separate mirror group 19 which are arranged in these columns 51, S2 are in each case offset relative to each other in the y-direction by half the y-extension of the separate mirrors 21. In other adjacent columns, compare the columns S3 and S4, separate mirrors 21 of a separate mirror group 19 which are arranged next to each other in these columns are in each case offset relative to each other in the y-direction by a full y-extension of the separate mirrors 21. This offset allows a given large radius of curvature of the separate mirror groups 19 to be achieved despite the comparatively large y-extension of the respective separate mirrors 21. In this way, for instance the separate mirror group 19 may be adapted to a curved object field shape. One of the separate mirror groups 19 at the edge of FIG. 38 is highlighted to be more easily identifiable.

FIG. 39 shows another embodiment of an arrangement of separate mirrors 21 and an alternative grouping of these separate mirrors 21 into separate mirror groups 19. The separate mirror groups 19, which are only partially shown in the x-direction of FIG. 39, have an x/y aspect ratio which corresponds to that of the separate mirror groups 19 according to FIG. 38. In contrast to the separate mirror groups 19 according to FIG. 38, the separate mirror groups 19 according to FIG. 39 are of rectangular shape. Each of these separate mirror groups 19 according to FIG. 39 may illuminate a rectangular object field. It is conceivable as well to illuminate an arcuate object field using the rectangular separate mirror groups 19 according to FIG. 39; in this case, the grazing incidence mirror 18, for instance, (cf. FIG. 1) will then ensure a corresponding field formation.

The way the facet mirror 13 is tiled with the separate mirrors 21 resembles a house wall which is tiled with wooden shingles. Each of the separate mirror groups 19 includes seven rows of adjacent separate mirrors 21 which are arranged one above the other. Joints 140 between these rows are continuously horizontal, in other words they extend in the x-direction. Joints 141 between adjacent separate mirrors 21 in one of the rows are arranged at an angle T relative to the y-direction, i.e. relative to the direction of the column arrangement of the separate mirrors 21. In the illustrated embodiment, the angle T amounts to approximately 12°. Other joint angles T are conceivable as well, for instance joint angles T of 5°, 8°, 15°, 19° or 20°.

Each of the separate mirrors 21 has an x/y aspect ratio which corresponds to the x/y aspect ratio of the separate mirrors 19. According to FIG. 39, this seems not to be the case; this is due to the fact that the separate mirrors 21 are shown in a compressed view when seen in the x-direction.

The projection exposure apparatus 1 is used to image at least a part of the reticle in the object field 5 onto a region of a light-sensitive layer on the wafer in the image field 8 for lithographic production of a micro- or nanostructured component, in particular a semiconductor component such as a microchip. Depending on whether the projection exposure apparatus 1 is designed as a scanner or a stepper, the reticle and the wafer are displaced in the y-direction in a temporally synchronized manner, namely either continuously when operating in the scanner mode or incrementally when operating in the stepper mode.

A defined setting of tilt angles for the separate mirrors 21 and 69 allows an intensity scanning profile, in other words an intensity distribution, of the imaging light 10 to be defined across the image field 8 in the y-direction if these separate mirrors 21 and 69 are not arranged in field planes of the illumination optics. A scanning profile of this type may be a function of the y-coordinate resembling a Gaussian distribution. Alternatively, a scanning profile of this type may be a function of the y-coordinate in the shape of a trapezoid. An alternative scanning profile of this type may also be obtained by convolving a rectangular function with a Gaussian function.

What is claimed is:

1. A facet mirror, comprising:
   a plurality of separate mirrors;
   a plurality of actuators; and
   a control device,
   wherein:
      each of the plurality of separate mirrors is connected to an actuator so that each of the plurality of separate mirrors is tiltable about at least one tilt axis via a separate actuation;
      the control device is configured to control the actuators by grouping the plurality of separate mirrors into a plurality of mirror groups, each mirror group comprising at least two separate mirrors;
      the control device is configured so that, in a first mode, actuation of the individual separate mirrors of one mirror group is different from actuation of the separate individual mirrors of all other mirror groups;
      the separate mirror groups form separate facets having a facet shape corresponding to a field shape of an object field to be illuminated in the projection exposure apparatus;
      depending on the size and the shape of the separate mirror groups, a corresponding size and shape of an object field to be illuminated is achievable; and
      the facet mirror is configured to be used in a projection exposure apparatus for microlithography.

2. The facet mirror according to claim 1, wherein the separate mirror groups have a rectangular envelope.

3. The facet mirror according to claim 1, wherein the separate mirror groups have an envelope selected from the group consisting of an arcuate envelope, an annular envelope and a circular envelope.

4. The facet mirror according to claim 1, wherein the separate mirror groups form mirror regions which have an arrangement that corresponds to an illumination angle distribution in an object field to be illuminated in the projection exposure apparatus.

5. The facet mirror according to claim 1, wherein the separate mirrors are polygonal and cover separate facets or mirror regions in the manner of a tiling.

6. The facet mirror according to claim 1, wherein the facet mirror is configured so that actuating individual separate mirrors corrects a homogeneity of an illumination intensity across an object field to be illuminated in the projection exposure apparatus.

7. The facet mirror according to claim 1, wherein the facet mirror is configured so that actuating individual separate mirrors corrects a field-dependent illumination intensity profile of an object field to be illuminated in the projection exposure apparatus.

8. The facet mirror according to claim 1, wherein the facet mirror is configured so that individually actuating separate mirrors sets an illumination intensity distribution of a pupil plane in dependence of a size or a shape of a field to be illuminated.

9. An illumination optics, comprising:
   a facet mirror according to claim 1,
   wherein the illumination optics are configured to illuminate an object field in a projection exposure apparatus.

10. The illumination optics according to claim 9, wherein the separate mirror groups are allocated to separate-mirror illumination channels configured to illuminate adjacent object field portions in the object field, and a combination of the adjacent object field portions defines the entire object field.

11. An apparatus, comprising:
    illumination optics configured to illuminate an object field; and
    a projection optics configured to image the object field an image field,
    wherein the illumination optics comprises a facet mirror of claim 1, and the apparatus is a microlithography projection exposure apparatus.

12. The apparatus according to claim 11, wherein the facet mirror is a specular reflector arranged to be in a beam path of illumination light.

13. The apparatus according to claim 11, further comprising:
    a reticle holder configured to hold a reticle in the object field; and
    a wafer holder configured to hold a wafer in the image field,
    wherein:
       during use of the projection optics, the reticle holder and wafer holder are synchronously displaced in a scanning direction of the projection exposure apparatus;
       the object field has a long field axis and a short field axis; and
       the scanning direction of the projection exposure apparatus is tilted by an angle $\alpha$ relative to the long field axis of the object field.

14. A method of using a microlithography projection exposure apparatus comprising an illumination optics and a projection optics, the method comprising:
    using the illumination optics to illuminate an object field; and
    using the projection optics to project the object field into an image field,
    wherein the illumination optics comprises a facet mirror of claim 1.

15. The method according to claim 14, wherein the facet mirror is a specular reflector arranged to be in a beam path of illumination light.

16. The method according to claim 14, wherein:
- the projection exposure apparatus further comprises:
  - a reticle holder configured to hold a reticle in the object field; and
  - a wafer holder configured to hold a wafer in the image field;
- the object field has a long field axis and a short field axis;
- a scanning direction of the projection exposure apparatus is tilted by an angle $\alpha$ relative to the long field axis of the object field; and
- the method further comprises synchronously displacing the reticle holder and wafer holder in a scanning direction of the projection exposure apparatus.

* * * * *

UNITED STATES PATENT AND TRADEMARK OFFICE
CERTIFICATE OF CORRECTION

PATENT NO. : 9,996,012 B2
APPLICATION NO. : 15/202104
DATED : June 12, 2018
INVENTOR(S) : Udo Dinger et al.

Page 1 of 1

It is certified that error appears in the above-identified patent and that said Letters Patent is hereby corrected as shown below:

On the Title Page

Column 1, (*) Notice:, Line 3, after "0 days." delete "days.".

In the Specification

Column 6, Line 55, delete "facets." and insert -- facets; --.

Column 18, Line 41-48, delete "by the specular reflector 70, which allows the object field 5 to be illuminated with good homogeneity. This reduces the effects on the homogeneity of the object field illumination which are due to changes of the emission properties of the radiation source 3 or changes, in particular across the surface, of the reflectivities of optical systems arranged upstream of the specular reflector 70 for instance as a result of selective contamination of the mirror surfaces." and insert the same on Column 18, Line 40, as a continuation of the same paragraph.

Column 23, Line 32, delete "20" and insert -- 20 µm, --.

Column 24, Line 26, delete "51" and insert -- S1 --.

Column 24, Line 28, delete "51" and insert -- S1, --.

In the Claims

Column 26, Line 35, in Claim 11, after "field" insert -- into --.

Signed and Sealed this
Twenty-third Day of April, 2019

Andrei Iancu
*Director of the United States Patent and Trademark Office*